United States Patent
Atsuta

(10) Patent No.: US 9,823,543 B2
(45) Date of Patent: Nov. 21, 2017

(54) DRIVER OF VIBRATOR, METHOD OF DRIVING THE SAME, LENS DRIVER, VIBRATION DEVICE, AND IMAGING DEVICE

(71) Applicant: CANON KABUSHIKI KAISHA, Tokyo (JP)

(72) Inventor: Akio Atsuta, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 12 days.

(21) Appl. No.: 14/574,296

(22) Filed: Dec. 17, 2014

(65) Prior Publication Data
US 2015/0180373 A1   Jun. 25, 2015

(30) Foreign Application Priority Data

Dec. 20, 2013 (JP) .................. 2013-263554
Oct. 29, 2014 (JP) .................. 2014-220843

(51) Int. Cl.
*G02B 7/02* (2006.01)
*H02N 2/00* (2006.01)
(Continued)

(52) U.S. Cl.
CPC .............. *G03B 3/10* (2013.01); *G02B 7/02* (2013.01); *G02B 7/08* (2013.01); *H01L 41/042* (2013.01);
(Continued)

(58) Field of Classification Search
CPC .. G02B 7/02; G02B 7/09; G02B 7/102; H02P 31/00; H02N 2/001; H02N 2/0015; H02N 2/004; H02N 2/025; H02N 2/026; H02N 2/06; H02N 2/062; H02N 2/103; H02N 1/142; H02N 2/0075; H01L 41/04;
(Continued)

(56) References Cited

U.S. PATENT DOCUMENTS 5,854,528 A * 12/1998 Nishikura ............... H02N 2/16
                                                                310/323.01
5,859,490 A *  1/1999 Saya ..................... H02N 2/026
                                                                310/316.02
(Continued)

FOREIGN PATENT DOCUMENTS

JP    2004-320846 A    11/2004
JP    2006-304439 A    11/2006

*Primary Examiner* — Loha Ben
(74) *Attorney, Agent, or Firm* — Canon U.S.A., Inc. IP Division

(57) ABSTRACT

One aspect of the present invention relates to a driver of a vibrator including: a control section; and an alternating current signal generation section configured to generate an alternating current signal based on an output from the control section, and to apply the alternating current signal to the vibrator, wherein the control section is configured to lower a frequency of the alternating current signal, and to change, after the frequency change, at least one of a voltage ratio and a phase difference of the alternating current signal such that the ellipse ratio of the elliptical motion changes from a first ellipse ratio to a second ellipse ratio, the second ellipse ratio has a larger ratio of a component in a moving direction in the elliptical motion to a component in a direction perpendicular to the moving direction in the elliptical motion than the first ellipse ratio.

21 Claims, 20 Drawing Sheets

(51) Int. Cl.
  *G03B 3/10* (2006.01)
  *H01L 41/04* (2006.01)
  *H01L 41/09* (2006.01)
  *G02B 7/08* (2006.01)
  *H02N 2/02* (2006.01)
  *G02B 7/09* (2006.01)
  *H02N 2/06* (2006.01)
  *H02P 31/00* (2006.01)

(52) U.S. Cl.
  CPC .......... *H01L 41/09* (2013.01); *H01L 41/0926* (2013.01); *H02N 2/001* (2013.01); *H02N 2/025* (2013.01); *H02N 2/062* (2013.01); *G02B 7/09* (2013.01); *G03B 2205/0061* (2013.01); *H02N 2/06* (2013.01); *H02P 31/00* (2013.01)

(58) Field of Classification Search
  CPC ... H01L 41/042; H01L 41/09; H01L 41/0933; H01L 41/08; H01L 41/082; H01L 41/083; G03B 2205/0046; G03B 2205/0061
  USPC .............. 359/811, 813, 814, 819, 823, 824; 310/314, 316.01, 316.02, 317, 318
  See application file for complete search history.

(56) References Cited

U.S. PATENT DOCUMENTS

| | | | | |
|---|---|---|---|---|
| 6,020,673 A * | 2/2000 | Matsumoto | .............. | H02N 2/06 310/316.02 |
| 6,078,438 A * | 6/2000 | Shibata | .................... | G02B 7/08 359/819 |
| 7,109,639 B2 * | 9/2006 | Yamamoto | ........... | H02N 2/0015 310/323.01 |
| 7,187,104 B2 * | 3/2007 | Yamamoto | ........... | H02N 2/0015 310/316.01 |
| 7,457,060 B2 * | 11/2008 | Paik | ....................... | G02B 7/102 359/703 |
| 7,573,180 B2 * | 8/2009 | Funakubo | .............. | H02N 2/026 310/316.01 |
| 7,595,947 B2 * | 9/2009 | Lee | ......................... | G02B 7/021 310/323.01 |
| 7,706,089 B2 * | 4/2010 | Koc | ......................... | G02B 7/021 359/819 |
| 7,764,449 B2 * | 7/2010 | Koc | ......................... | G02B 7/08 359/694 |
| 7,960,895 B2 | 6/2011 | Adachi | | |
| 8,669,723 B2 * | 3/2014 | Kudo | .................. | H02N 2/0015 310/323.02 |

* cited by examiner

DRIVER OF VIBRATOR, METHOD OF DRIVING THE SAME, LENS DRIVER, VIBRATION DEVICE, AND IMAGING DEVICE

BACKGROUND OF THE INVENTION

Field of the Invention

One aspect of the present invention relates to a driver of a vibrator, a method of driving the same, a lens driver, a vibration device, and an imaging device.

Description of the Related Art

Vibration-type actuators in a system that applies an alternating current signal to an electro-mechanical transducer to obtain driving force in a vibrating body, and drives a lens of a camera, a video, or the like have been proposed by the applicant of the present invention, and the like.

FIG. 16 is a perspective view of an appearance illustrating an example of a basic configuration of the conventional vibration-type actuator.

As illustrated in FIG. 16, a vibrator of the vibration-type actuator includes an elastic member 4 made of a metal material formed into a rectangular plate, and a piezoelectric element (electro-mechanical transducer) 5 is joined to a back surface of the elastic member 4.

One obtained such that the elastic member 4 and the piezoelectric element 5 are affixed and integrated is referred to as vibrator. Here, a plurality of projection portions 6 is provided at predetermined positions on an upper surface of the elastic member 4.

FIG. 17A and FIG. 17B are diagrams illustrating secondary bending oscillation in a long side direction of the elastic member 4 of the vibration-type actuator and primary bending oscillation in a short side direction of the elastic member 4.

Here, the secondary bending oscillation in the long side direction is referred to as A mode (See FIG. 17A), and the primary bending oscillation in the short side direction is referred to as B mode (See FIG. 17B).

According to the above-described configuration, when the alternating current voltage is applied to the piezoelectric element 5, the A mode and the B mode are generated at the same time, and elliptical motion is excited in the projection portions 6.

Then, a driven body 7 is brought into pressure-contact with the projection portions 6, whereby the driven body 7 can be linearly driven by the elliptical motion of the projection portions 6. That is, the projection portions 6 functions as a driver unit of the vibrator.

FIG. 18 is a diagram illustrating an electrode pattern of the piezoelectric element 5, and electrode areas that are two equal portions divided in a longitudinal direction (X direction) are formed. Further, polarization directions in the respective electrode areas are the same direction ("+").

An alternating current voltage (V1) is applied to an A electrode area positioned on the right side of FIG. 18, and an alternating current voltage (V2) is applied to a B electrode area positioned on the left side, of the two electrode areas of the piezoelectric element 5.

In FIG. 18, the right-side electrode area of the piezoelectric element 5 is contracted and the left-side electrode area is expanded at a certain moment, where the V1 and V2 are the alternating current voltages having a frequency in the vicinity of a resonant frequency of the A mode, and having phases shifted by 180°.

Further, the two electrode areas have an inverse relationship at another moment. As a result, vibration of the A mode illustrated in FIG. 17A is generated in the vibrator.

Further, the entire piezoelectric element 5 (the two electrode areas) is expanded at a certain moment, and is contracted at another moment, where the V1 and V2 are the alternating current voltages having a frequency in the vicinity of a resonant frequency of the B mode, and having the same phase.

As a result, vibration of the B mode illustrated in FIG. 17B is generated in the vibrator. As described above, each vibration in the vibrator is combined, whereby the moving body brought into pressure-contact with the projection portions 6 is driven in the arrow direction of FIG. 16. Further, an occurrence ratio of the A mode and the B mode can be changed by changing of the phase difference of the voltages to be input to the two equally divided electrodes.

A configuration and a driving principle of such a vibration-type actuator are described in Japanese Patent Application Laid-Open No. 2004-320846, and the like, and thus description is omitted.

Note that the vibrator is a vibration generation section in which the elastic member and the piezoelectric element are affixed, the vibration-type actuator is a portion that generates driving force that brings the vibrator and the moving body into pressure-contact and moves the moving body, and a vibration-type actuator device includes at least one or more of the driving force portions, and the driving force is provided to a moving portion, whereby rotary motion or linear motion becomes possible.

FIG. 19 is a diagram illustrating a relationship between a speed and consumption power of the actuator with respect to a drive frequency when driving and controlling the vibration-type actuator.

In control of the vibration-type actuator, speed control of measuring the speed of the pressurized and frictionally driven moving body, decreasing the frequency and increasing the speed when the detected speed is lower than a target speed, and increasing the frequency to a higher frequency and decreasing the speed when the detected speed is larger than the target speed is performed.

As a characteristic of the vibration-type actuator, when the drive frequency is lowered, input electric power is increased and an output is also increased.

Here, a relationship between the speed and the consumption power when a load is increased is illustrated by the dotted line. It can be seen that the speed is zero, that is, the actuator cannot be started at the dotted line of the drive frequency.

Under this state, when the frequency is decreased until the actuator is started, the actuator cannot be started and becomes non-start, or a phenomenon occurs, in which the actuator is started at a sharp speed at a frequency decreased from the drive frequency.

As described above, even if the actuator can be started, the actuator rises at a sharp speed, and smooth start becomes difficult. Further, the input electric power when started becomes large, and may become larger than set allowable electric power.

Further, while a state in which a load becomes large has been described above, a similar phenomenon occurs when startability is degraded due to variation or degradation of the vibrator.

SUMMARY OF THE INVENTION

In the vibration-type actuator device using a conventional drive control system, a phenomenon occurs, such as the actuator sharply rises when the startability is degraded, or the consumption power becomes large, due to load variation or change of characteristics of the actuator.

As means for improving the startability, increasing the driving voltage to increase an oscillation amplitude can be considered. However, with such means, a circuit to increase the driving voltage is required at the time of start. Further, if a configuration to always start the actuator at a high voltage is employed, the consumption power is increased, and actuator efficiency is deteriorated.

One aspect of the present invention relates to a driver of a vibrator including: a control section; and an alternating current signal generation section configured to generate an alternating current signal based on an output from the control section, and to apply the alternating current signal to the vibrator, wherein, at a time of driving the vibrator, the control section is configured to perform first setting of setting a frequency of the alternating current signal applied to the vibrator to a first frequency, and setting at least one of a voltage ratio and a phase difference of the alternating current signal applied to the vibrator such that an ellipse ratio of elliptical motion caused in a driver unit of a vibrating body becomes a first ellipse ratio, to perform, after the first setting, second setting of setting the ellipse ratio to the first ellipse ratio, and setting the frequency of the alternating current signal applied to the vibrator to a second frequency, and to perform, after the second setting, third setting of setting the frequency of the alternating current signal applied to the vibrator to the second frequency, and setting at least one of the voltage ratio and the phase difference of the alternating current signal applied to the vibrator such that the ellipse ratio of the elliptical motion caused in the driver unit of the vibrating body becomes a second ellipse ratio, the second frequency is smaller than the firs frequency, and the second ellipse ratio has a larger ratio of a component in a moving direction in the elliptical motion to a component in a direction perpendicular to the moving direction in the elliptical motion than the first ellipse ratio.

Further, one aspect of the present invention relates to a vibration device including: a vibrating body including an elastic member including a driver unit, and an electromechanical transducer fixed to the elastic member; a control section; and an alternating current signal generation section configured to generate an alternating current signal based on an output from the control section, and to apply the alternating current signal to the vibrator, wherein, at a time of driving the vibrator, the control section is configured to perform first setting of setting a frequency of the alternating current signal applied to the vibrator to a first frequency, and setting at least one of a voltage ratio and a phase difference of the alternating current signal applied to the vibrator such that an ellipse ratio of elliptical motion caused in a driver unit of a vibrating body becomes a first ellipse ratio, to perform, after the first setting, second setting of setting the ellipse ratio to the first ellipse ratio, and setting the frequency of the alternating current signal applied to the vibrator to a second frequency, and to perform, after the second setting, third setting of setting the frequency of the alternating current signal applied to the vibrator to the second frequency, and setting at least one of the voltage ratio and the phase difference of the alternating current signal applied to the vibrator such that the ellipse ratio of the elliptical motion caused in the driver unit of the vibrating body becomes a second ellipse ratio, the second frequency is smaller than the firs frequency, and the second ellipse ratio has a larger ratio of a component in a moving direction in the elliptical motion to a component in a direction perpendicular to the moving direction in the elliptical motion than the first ellipse ratio.

Further, one aspect of the present invention relates to a method of driving a vibrator, including: at a time of driving the vibrator, setting a frequency of the alternating current signal applied to the vibrator to a first frequency, and setting at least one of a voltage ratio and a phase difference of the alternating current signal applied to the vibrator such that an ellipse ratio of elliptical motion caused in a driver unit of a vibrating body becomes a first ellipse ratio, after the first setting, setting the ellipse ratio to the first ellipse ratio, and setting the frequency of the alternating current signal applied to the vibrator to a second frequency, and after the second setting, setting the frequency of the alternating current signal applied to the vibrator to the second frequency, and setting at least one of the voltage ratio and the phase difference of the alternating current signal applied to the vibrator such that the ellipse ratio of the elliptical motion caused in the driver unit of the vibrating body becomes a second ellipse ratio, wherein the second frequency is smaller than the firs frequency, and the second ellipse ratio has a larger ratio of a component in a moving direction in the elliptical motion to a component in a direction perpendicular to the moving direction in the elliptical motion than the first ellipse ratio.

Note that the ellipse ratio in the present application is a ratio of a component in a direction into which a driven body and the vibrating body are pressurized to a component in a direction into which the driven body is driven, in the elliptical motion, and movement has larger force to push away the vibrating body and the driven body as the ellipse ratio becomes larger.

Further features of the present invention will become apparent from the following description of exemplary embodiments (with reference to the attached drawings).

DESCRIPTION OF THE EMBODIMENTS

Figure 1:
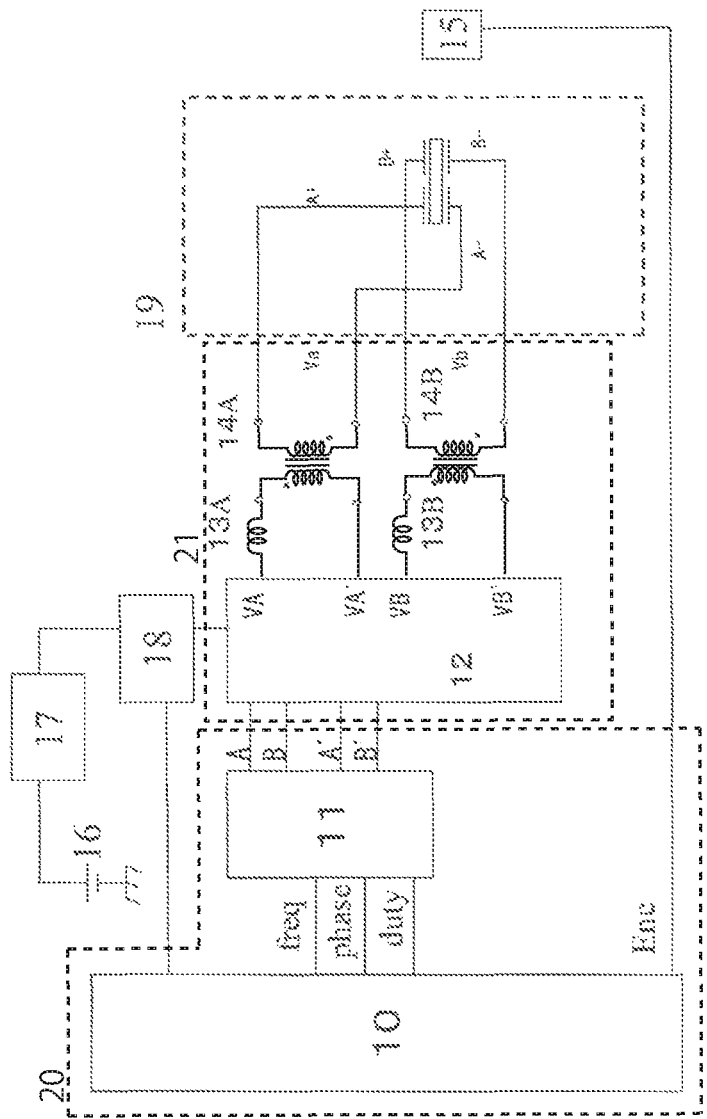
FIG. 1 is a block diagram illustrating a configuration of a control circuit in a driver of a vibrator.

A driver of a vibrator of the present embodiment includes a vibrating body in which an electro-mechanical transducer is fixed to an elastic member, and a driver that causes an elliptical motion in a driver unit of the vibrating body to relatively move the driven body, by applying an alternating current signal to the electro-mechanical transducer. Further, the driver includes a control section that sets a phase, a frequency, a voltage amplitude, and the like of the alternating current signal, and an alternating current signal generation section that generates the alternating current signal based on an output of the control section.

The elliptical motion can be configured to cause by combining a first vibration mode caused in the vibrating body when alternating current voltages having the same phase are applied to two divided electrodes included in the electro-mechanical transducer, and a second vibration mode caused in the vibrating body when the alternating current voltages having reversed phases are applied to the electrodes. At that time, the electrodes can be configured from a plurality of divided electrodes of one or more first electrodes provided to generate the first vibration mode, and one or more second electrodes provided to generate the second vibration mode. Further, the elliptical motion can be configured such that the ellipse ratio caused in the driver unit of the vibrating body is changed by adjustment of a phase difference between the alternating current voltages applied to the two electrodes.

Note that the ellipse ratio caused in the driver unit of the vibrating body can be configured to change by adjustment of a voltage ratio of the two alternating current voltages with an electrode structure of the electro-mechanical transducer.

Then, when the vibration-type actuator is started, the ellipse ratio of the elliptical motion caused in the drive unit of the vibrating body is caused to be a first ellipse ratio, and then the frequency of the alternating current signal is swept into a direction into which the frequency becomes lowered, and the ellipse ratio of the elliptical motion caused in the driver unit of the vibrating body when the driven body is relatively moved is caused to be a second ellipse ratio having a larger ratio of a direction into which force to drive the driven body is generated than the first ellipse ratio.

For example, when the vibration-type actuator device is started, a phase difference between driving voltages A and B is set to a first phase difference having a smaller value than the phase difference at an normal operation, and the elliptical motion having a different vibration shape is generated in a contact portion, whereby startability is improved and smooth start is realized. Meanwhile, after the start is confirmed, the phase difference is set to a normal second phase difference, and speed control is performed after speed/thrust can be obtained.

Accordingly, a driver of a vibrator and a method for driving the vibrator can be realized, which enable stable start where sharp rising of the speed is prevented, and an increase in the consumption power at the time of start is not caused.

[Exemplary Embodiment]

Hereinafter, embodiments of the present invention will be described.

[First Embodiment]

Configuration examples of a vibrator to which the present invention is applied and of a method for driving the vibrator will be described, as a first embodiment.

FIG. 1 is a diagram for describing a vibration device of the present embodiment, and is a block diagram illustrating a vibrator and a circuit configuration of the driver of the vibrator. That is, in the present specification, the vibration device includes the vibrator and a driving circuit of the vibrator.

A vibrator 1 includes an electro-mechanical transducer, and the driver applies a voltage of a predetermined frequency in a vibration mode to the vibrator, thereby to drive a moving body.

An actuator 19 includes the vibrator. The driver includes a control section 20, an alternating current generation section 21, a DC/DC converter 17, and an electric power detection circuit section 18.

The control section 20 includes a controller 10, and an oscillator section 11, and the alternating current generation section 21 includes a switching circuit section 12, impedance elements 13A and 13B, and transformers 14A and 14B.

The controller 10 is a microcomputer section that controls a microcomputer, and the like. Hereinafter, the controller 10 is abbreviated as a microcomputer 10.

The oscillator section 11 generates a first pulse signal A that is a pulse signal of a resonant frequency of the vibrator, and a second signal B having the same frequency as and having a diff phase from the first signal A, according to a command value of the microcomputer 10. Respective pulse widths and the phase difference between the pulse signal A and the pulse signal B are variable.

Here, a pulse signal A' is a pulse signal having a 180-degree different phase from the pulse signal A, and a pulse signal B' is a pulse signal having a 180-degree different phase from the pulse signal B.

With a command of the microcomputer 10, a drive frequency, the phase difference between the AB, and the pulse widths of the AB, and the like are set, and the A, B, A', and B' pulse signals are output.

The switching circuit section 12 switches the A, B, A', and B' pulse signals with a power supply voltage, generates voltage pulses (driving voltages or driving signals) VA, VB, VA', and VB' to be applied to the vibrator based on the A, B, A', and B' pulse signals, and inputs the voltage pulses to the alternating current generation section 21.

Here, the VA and VB are input to primary sides of the transformers 14A and 14B through the impedance elements 13A and 13B for performing impedance matching with the vibrator.

Secondary side voltages of the transformers are applied to piezoelectric elements A+ and A−, and piezoelectric elements B+ and B− of the vibrator.

The impedance elements 13A and 13B are circuits having effects to increase the voltage and to perform filtering not to include unnecessary frequency components, by performing impedance matching with the piezoelectric elements of the vibrator using inductance.

The direct current power supply 16 is a battery, for example.

The DC/DC converter 17 increases or decreases the voltage of the direct current power supply to a necessary voltage to eliminate voltage variation.

Here, if the direct current power supply 16 is a stabilized power supply that can output a necessary voltage, the DC/DC converter 17 is not necessary.

The electric power detection circuit section 18 detects electric power of when the vibrator (or the vibration-type actuator) is driven by the switching circuit section 12, and notifies the detected value to the microcomputer 10.

Here, the detected electric power is the product of the voltage and the current, and if the power supply voltage is a fixed value, the magnitude of the electric power can be monitored with the current value.

The position detection means 15 is formed of a photo-interrupter and a slit plate, for example, and detects a rotation position of a rotating portion. With a result obtained with the position detection means 15, the position of a rotating body and speed information are passed to the microcomputer 10, and the microcomputer controls the actuator according to the position and the information.

Figure 2:
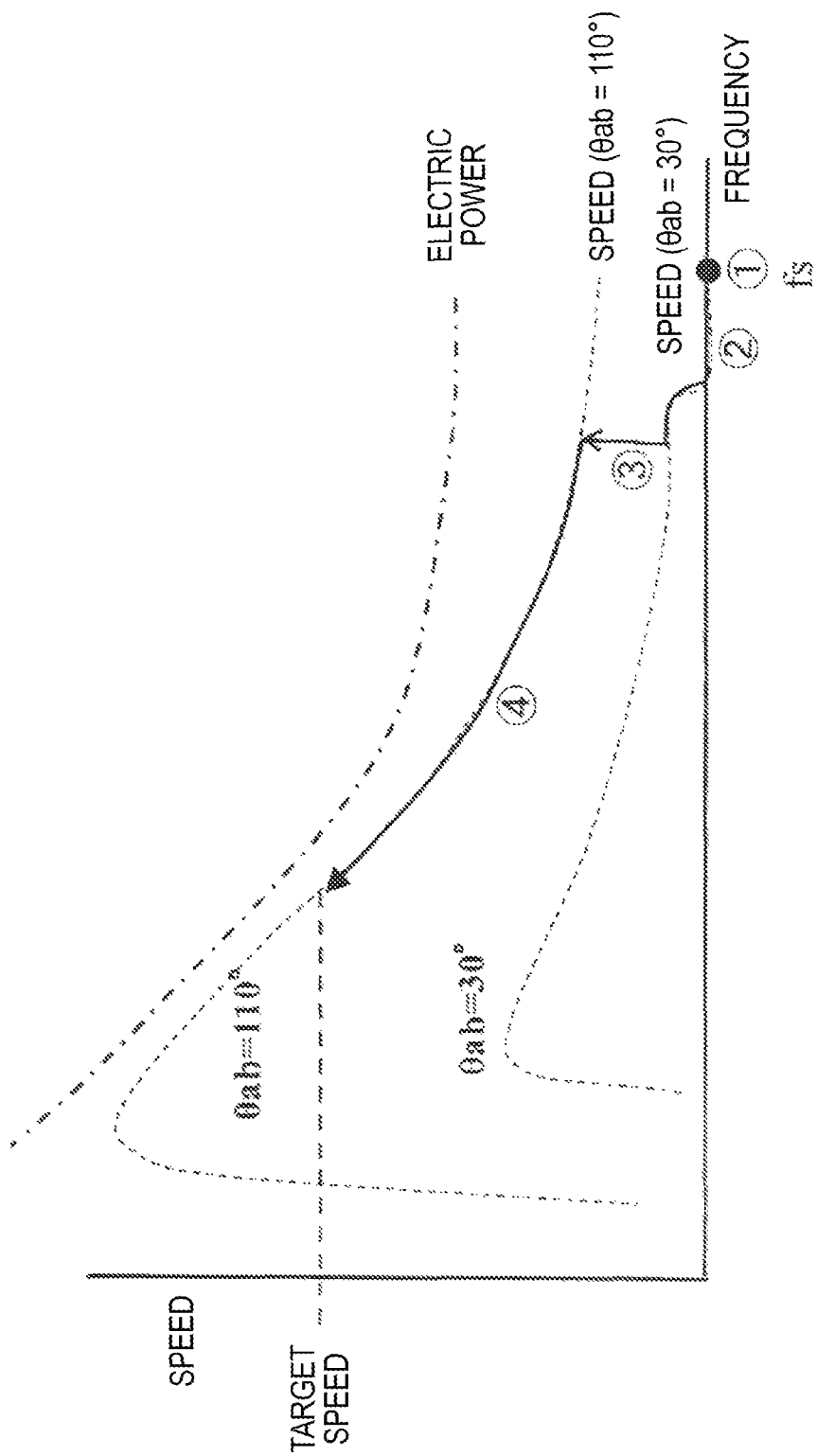
FIG. 2 is a diagram illustrating a frequency vs. an actuator speed and electric power, for describing an algorithm in the driver of the vibrator.

FIG. 2 is a diagram illustrating a relationship of a frequency vs. an actuator speed, and electric power, for describing an algorithm of the present embodiment.

Figure 3:
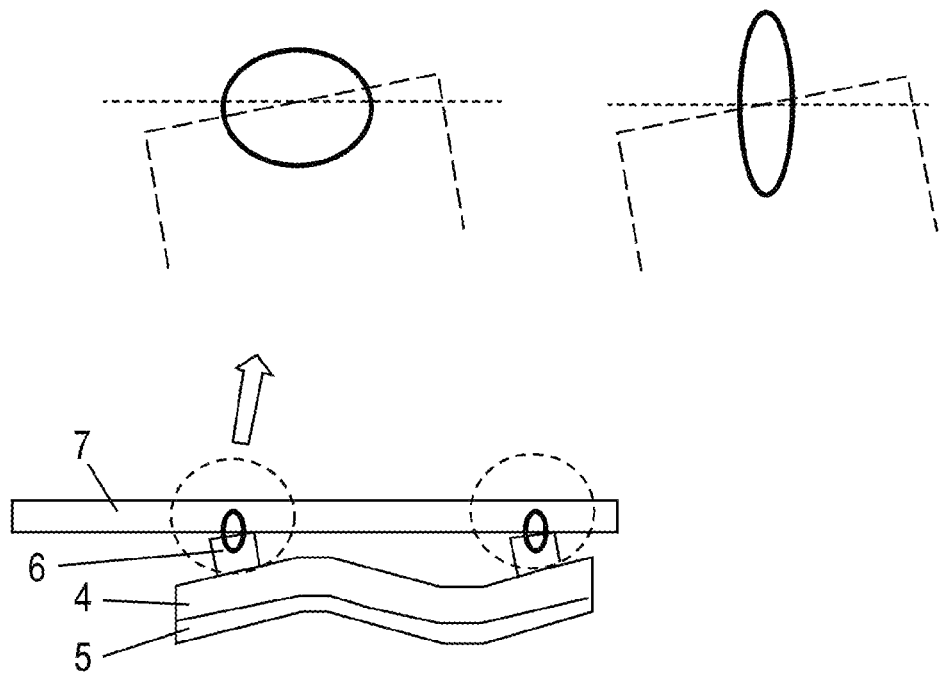
FIG. 3 is an image diagram of elliptical shapes of a contact portion in a first phase difference and a second phase difference in the driver of the vibrator.

FIG. 3 is a diagram of an image of elliptical vibration generated in a contact portion of a projecting portion 6 by changing of a phase difference between applied voltages of A and B, the elliptical vibration being one of ellipse ratio change means illustrated in the present embodiment.

Figure 17A:
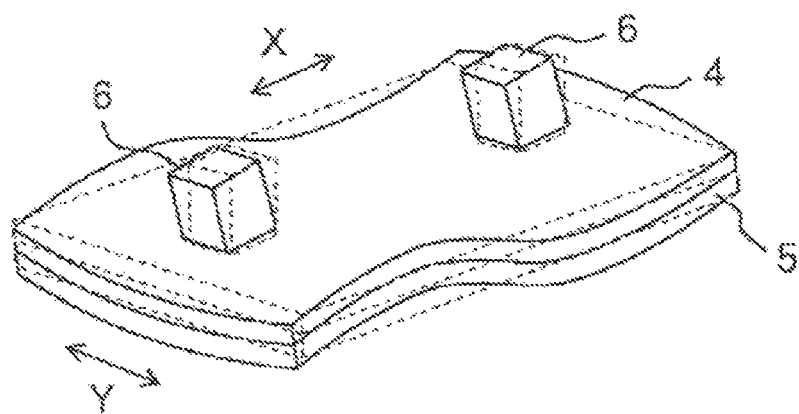
FIG. 17A and FIG. 17B are diagrams illustrating vibration modes of a vibration-type actuator.
Figure 19:
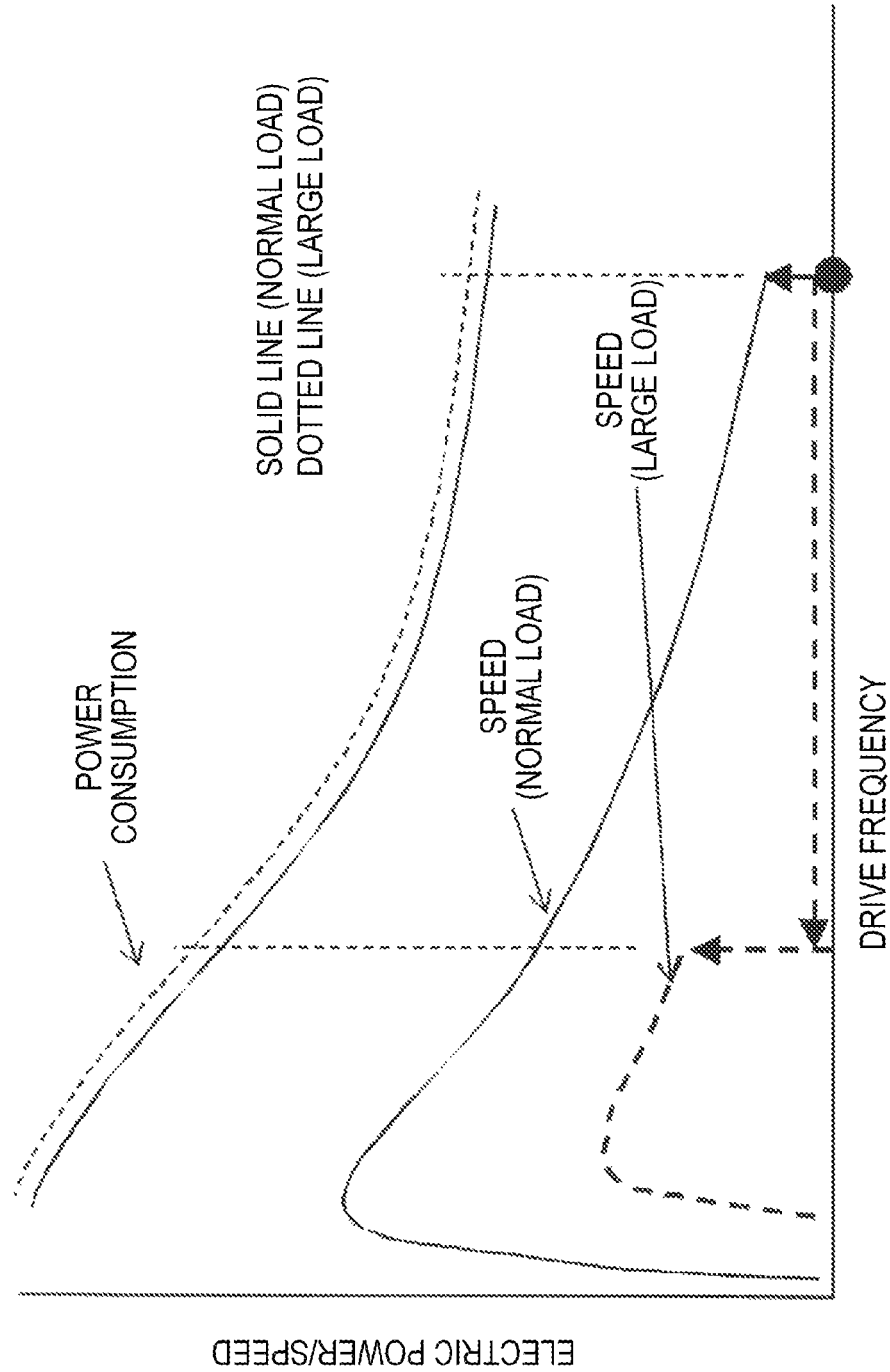
FIG. 19 is a diagram illustrating a frequency vs. electric power, a phase difference, and a speed for describing a control circuit.

When V1 and V2 in which the phase difference between the applied voltages of the AB electrodes of the piezoelectric element illustrated in FIG. 19 is 180° are applied, vibration that an A electrode portion is expanded and a B electrode portion is contracted is generated in the vibrator at a certain time, and vibration that the A electrode is contracted and the B electrode is expanded is generated in the vibrator at a certain time, as illustrated in FIG. 17A.

When focusing on a point of a central portion of a contact portion in the projecting portion 6 of this time, for example, and confirming a locus of that point, movement in a direction X, into which the vibrator drives the moving body, is generated.

Figure 17B:
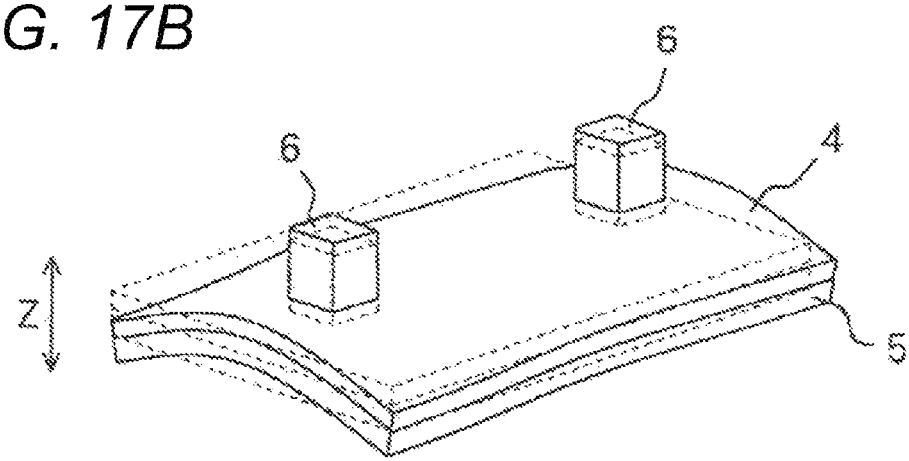
Figure 18:
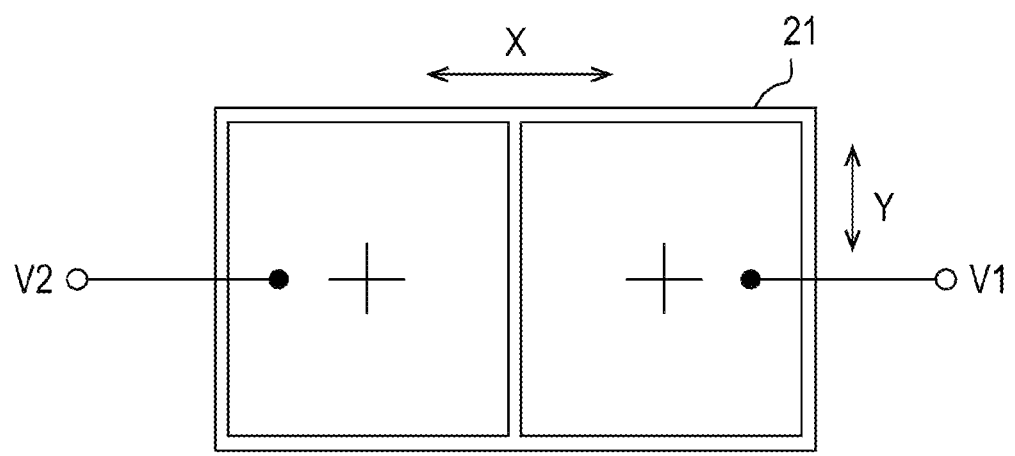
FIG. 18 is an electrode pattern diagram of a piezoelectric element used in a vibration-type actuator.

Next, when the driving voltages (driving signals) V1 and V2 in which the phase difference between the applied voltages of the AB electrodes of the piezoelectric element is 0° are added, vibration that the AB electrode portions are expanded at the same time is generated in the vibrator at a certain time, and vibration that the AB electrodes are contracted at the same time is generated in the vibrator at a certain time, as illustrated in FIG. 17B.

Movement in an up and down direction of a direction Z, into which the vibrator and the moving body are pushed away is generated in the contact portion. That is, the vibration of an elliptical shape is generated, such that the vibration in the direction Z, into which the vibrator and the moving body are pushed away, is generated when the phase difference between the applied voltages of the AB electrodes is 0°, and the movement in the direction X, into which the vibrator drives the moving body, is increased in the contact portion when the phase difference becomes 30°→60°→90° . . . →180°.

As described above, by changing of the phase difference between the applied voltages of the AB electrodes, the ellipse ratio of the elliptical motion generated in the contact portion can be changed.

Here, the value of the phase difference between the AB applied voltages (driving voltages or driving signals) is illustrated with a plus value, such as 30°. However, the value means both cases of −30° and +30°, and indicates that the phase difference between the AB is 30°.

Figure 4:
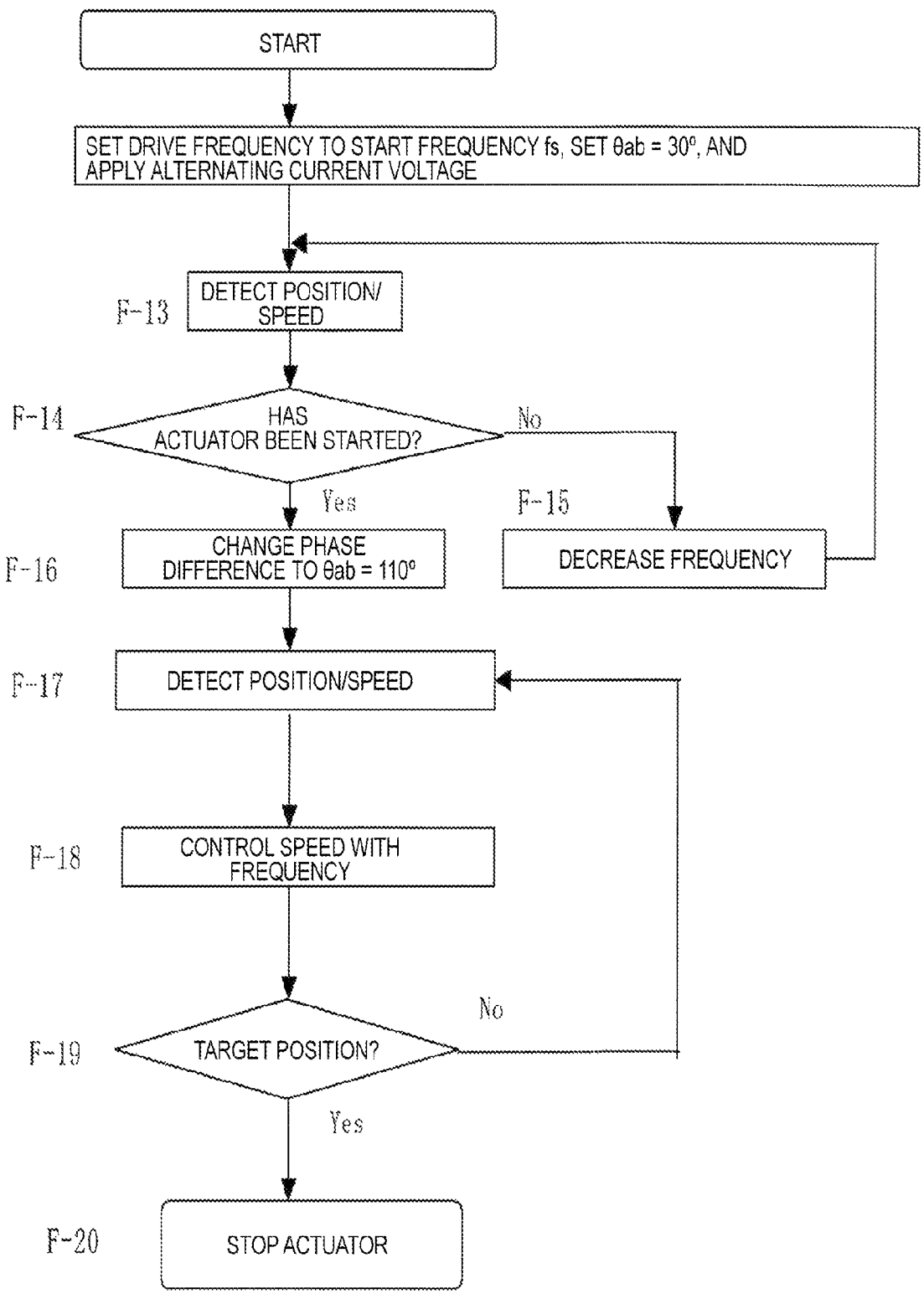
FIG. 4 is a flowchart illustrating the algorithm in the driver of the vibrator.

FIG. 4 illustrates an algorithm of the present embodiment, and an operation will be described with reference to FIGS. 2 and 3.

At the time of start of the actuator, the microcomputer 10 sets a frequency fs that is higher than a resonant frequency, and with which an actuator speed is sufficiently small, sets a phase difference Gab between the two driving voltages to be 30°, and applies an alternating current voltage to a vibrator portion (F-11, F-12) (a circled number 1 in FIG. 2).

The frequency fs at the time of start is set to fall within a range in which a problem of control is not caused, the problem such that the speed oscillates due to sudden change of the speed of a device (for example, a lens) including the moving body when the actuator is started, and a range in which vibration or impact is not felt visually or with hands from the speed change, which is measured using an acceleration sensor or the like in advance.

As can be seen from FIG. 3, when the phase difference θab between the driving voltages is 30°, the elliptical shape generated in the contact portion has a large component in the direction into which the vibrator and the moving body are pushed away, and having a small component in a moving direction of the moving body.

In this state, the speed of the moving body is not increased, but the vibrator and the moving body are more easily in contact or separated, and are easily started.

In the present embodiment, the phase difference θab between the driving voltages (driving signals) is 30°. However, the phase difference θab may be 20° or 10° as long as the vibrator and the moving body can be easily in contact or separated, and are not started at a sharp speed. An optimum phase difference is changed according to a pressurized state of the vibrator and the moving body, or a friction coefficient or a shape of a frictional surface.

For example, pressure of the vibrator and the moving body becomes large, and an amplitude in the direction into which the vibrator and the moving body are pushed away becomes small as the pressurization becomes large. Therefore, it can be considered that the elliptical shape becomes the elliptical shape of the contact portion, which is the same as before the pressurization becomes large, by decreasing of the phase difference θab of the driving voltages.

Further, it can be considered that a component in the moving direction of the moving body becomes small, in the shape of the elliptical motion generated in the contact portion, when frictional force becomes large. Therefore, it can be considered that the elliptical shape becomes the elliptical shape of the contact portion that is the same as before the friction coefficient becomes large, by increasing of the phase difference θab between the driving voltages.

In the present embodiment, the phase difference θab between the driving voltages is set, considering that start-ability is improved if the component in the direction into which the vibration and the moving body are pushed away at the time of start is larger, or the component in the moving direction of the moving body is smaller, than the shape of the elliptical motion of the contact portion, which is used in a normal driving state.

Next, the current position and speed is detected with the position detection means 15 (F-13).

Whether the actuator is started is determined from change of the position or the speed value (F-14).

When the actuator is not started, the drive frequency is decreased while the phase difference between the driving voltages of the AB is kept to 30°. The amount of decrease in the drive frequency is a value determined according to a time necessary for start or a state of a load (F-15).

F-13 to F-15 are repeated until the actuator is started (the circled number 2 in FIG. 2).

Here, when the actuator is started, the phase difference between the driving voltages (driving signals) of the AB is changed to 110°, and a ratio of the moving direction of the moving body to the direction into which the vibrator and the moving body are pushed away is caused to become large, in the elliptical motion generated in the contact portion.

With such an ellipse ratio, the moving body can be efficiently moved at a high speed (F-16) (the circled number 3 in FIG. 2).

The phase difference 110° between the driving voltages of the AB illustrated in the present embodiment is a value determined as the most efficient phase difference, as a result of obtaining efficiency from the relationship between an input and an output of the electric power while changing the phase difference between the driving voltages of the AB in the active state of the actuator.

As described above, frequency control of detecting the speed and the position while changing the frequency, and stopping the driving when the speed reaches a target position is performed in the state of the ellipse ratio with which the actuator is efficiently driven, that is, in the normal driving state (F-17 to F-20) (the circled number 4 of FIG. 2 illustrates the speed until reaching the target speed)).

As described above, the elliptical shape of the contact portion is caused to be the elliptical shape suitable for start at the time of starting the actuator, and after the start, the elliptical shape is caused to become the elliptical shape that can efficiently drive the actuator, whereby the problems such that the actuator cannot be started or is started at a sharp speed due to degradation of the starting characteristics as illustrated in FIG. 19 of a conventional example, or an increase in the load, or the actuator is started in the state of a large input of the electric power, can be prevented.

In the present embodiment, description has been given, in which the phase difference between the applied voltages of the AB (driving voltages or driving signals) that generate the first ellipse ratio is fixed to 30°, and the drive frequency is decreased. However, means for decreasing the drive frequency while changing the phase difference within a range smaller than 110° that generates the second ellipse ratio, i.e., a range from 60° to 0°, may be employed.

As described above, when the phase difference is changed, the elliptical shape is changed, and the elliptical shape optimum for start can be passed through, and the actuator can be more easily started.

[Second Embodiment]

A configuration example in which a method of changing a phase difference between AB as a parameter is improved so that an actuator can be more smoothly started at the time of start than the first embodiment will be described as a second embodiment.

Here, a configuration of a driving circuit, which is the same as that of FIG. 1 of the first embodiment, is used.

Figure 5:
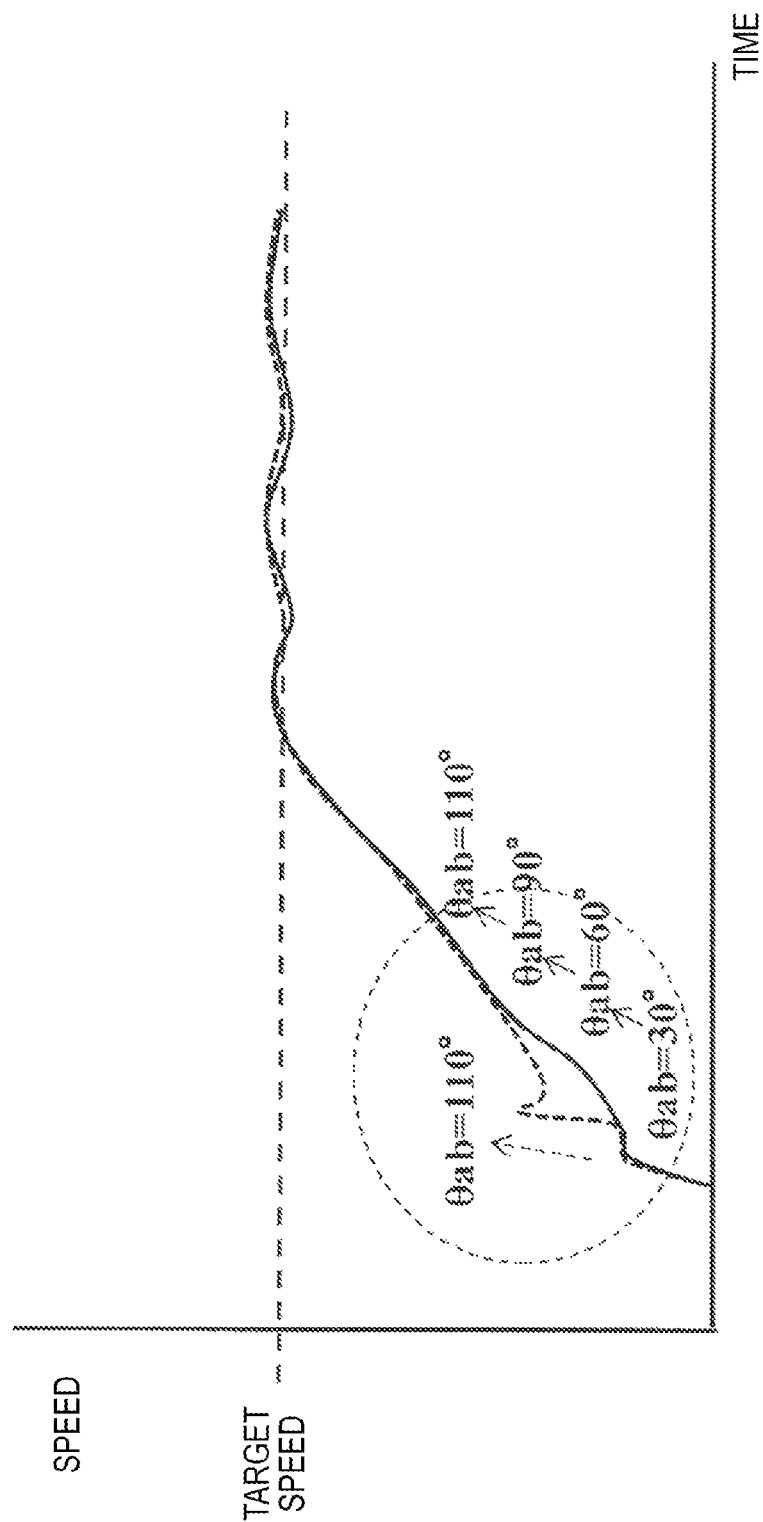
FIG. 5 is a diagram of a relationship between a time and a speed when an actuator is driven with an algorithm in a driver of a vibrator.

FIG. 5 illustrates a relationship between the time and the speed of when an actuator is driven with an algorithm of the second embodiment, and a procedure to change a phase difference between applied voltages of A and B after start is different from the first embodiment.

Figure 6:
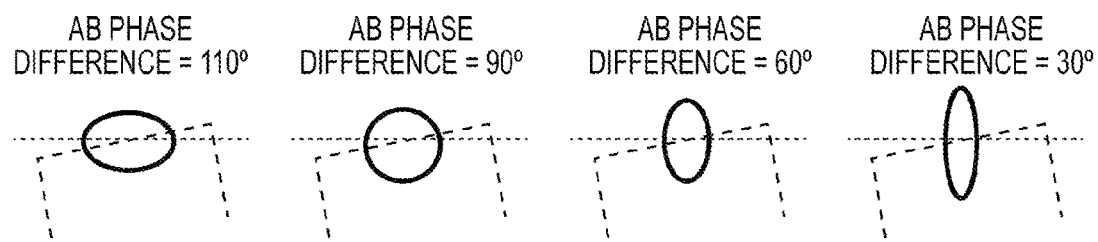
FIG. 6 is an image diagram of elliptical shapes of a contact portion used in the driver of the vibrator.

FIG. 6 illustrates an image of elliptical vibration generated in a contact portion of a vibrating body, by changing of the phase difference between the applied voltages of the A and B, the elliptical vibration being one of the ellipse ratio change means illustrated in the embodiments.

Figure 7:
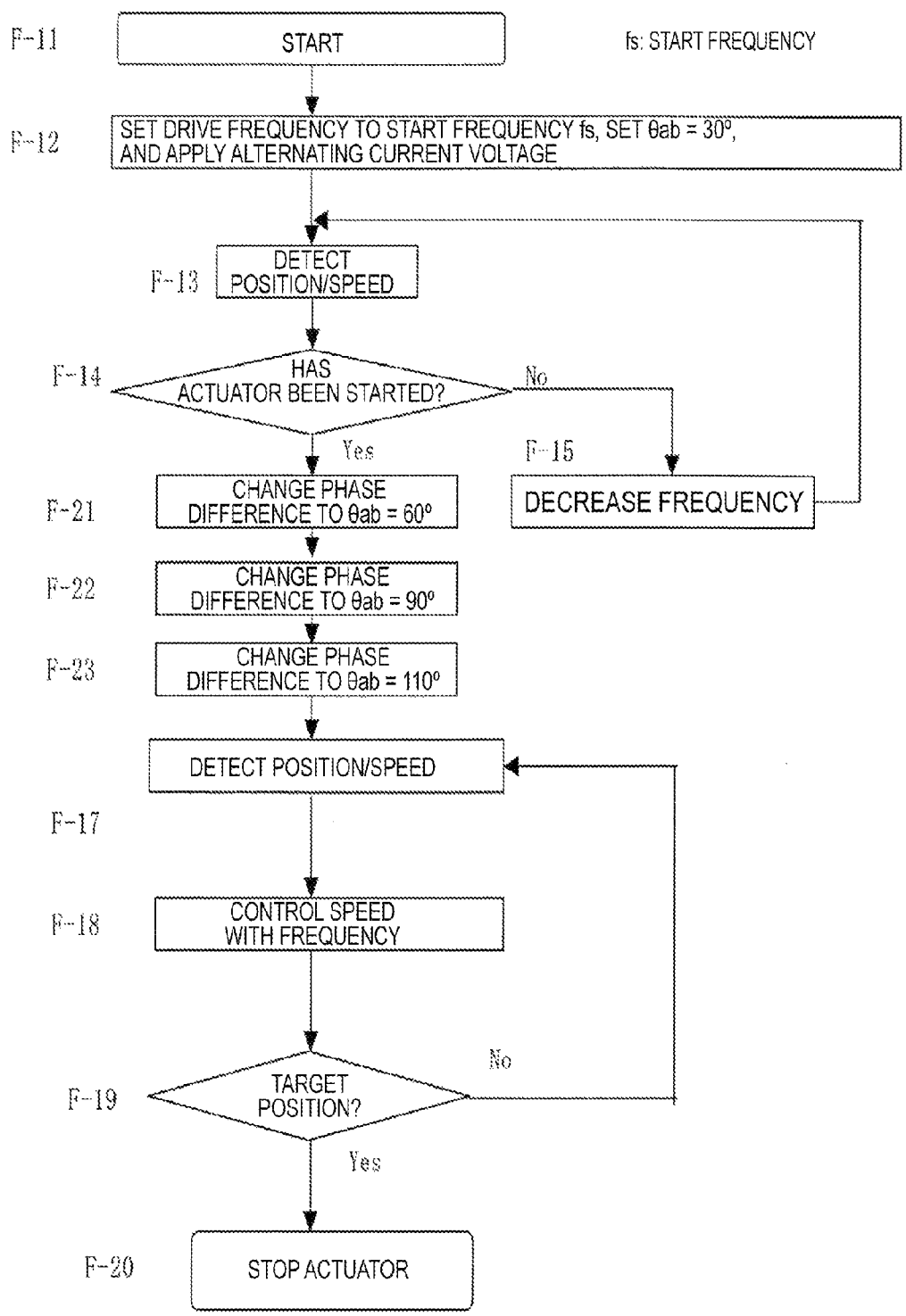
FIG. 7 is a flowchart illustrating the algorithm in the driver of the vibrator.

FIG. 7 illustrates the algorithm of the present embodiment, and an operation will be described with reference to FIGS. 5 and 6.

At the start of the actuator, similarly to the first embodiment, a frequency fs that is higher than a resonant frequency, and with which an actuator speed is sufficiently small is set, a phase difference Gab between two driving voltages is set to be 30°, and an alternating current voltage is applied to a vibrator portion (F-11 and F-12).

Next, a current position and speed are detected with position detection means 15 (F-13).

Whether the actuator is started is determined from change of the position or a speed value (F-14).

When the actuator is not actuated, the drive frequency is decreased while the phase difference between the driving voltages of the AB is kept to 30° (F-15).

F-13 to F-15 are repeated until the actuator is started.

Up to here, the algorithm is the same as the algorithm of the first embodiment.

Here, when the actuator is started, in the first embodiment, the phase difference between the driving voltages of the AB is suddenly changed to 110°, and the ratio of the direction into which the vibrator having the elliptical shape and the moving body are pushed away generated in the contact portion, and the moving direction of the moving body becomes large in the moving direction of the moving body. Here, when the elliptical shape of the contact portion is rapidly changed, sharp speed change is generated.

Further, influence (damage) on the frictional surface due to the rapid change of the frictional surface becomes large (the dotted line in FIG. 5).

Therefore, in the present embodiment, an elliptical shape of a contact portion is gradually changed, and a ratio of a moving direction of a moving body to a direction into which the vibrator and the moving body are pushed away becomes gradually large, in elliptical motion generated in the contact portion.

In the present embodiment, by changing of the phase difference between the driving voltages of the AB is changed such that 30°→60°→90°→110° with a started frequency, the elliptical shape of the contact portion is gradually changed (F-21 to F-23) (the solid line in FIG. 5).

In this way, after a state where the ellipse ratio is caused to be the ellipse ratio at which the actuator is efficiently driven, frequency control of detecting the speed and the position while changing the frequency in a normal driving state, and stopping the driving when the speed reaches a target position is performed, similarly to the first embodiment (F-17 to F-20).

FIG. 5 illustrates a relationship of a time vs. a speed of when the actuator is operated with the above-described algorithm, and is a diagram in which the dotted line indicates a speed characteristic of when the phase difference between the applied voltages of the A and B of the first embodiment is switched from 30° to 110°, and the solid line indicates the speed characteristic of when the phase difference between the driving voltages of the A and B of the present embodiment is changed such that 30°→60°→90°→110°.

As can be seen from FIG. 5, the phase difference between the driving voltages of the AB is gradually switched, whereby the actuator does not have the rapid speed change as illustrated by the dotted circle line, and can reach the target speed while smoothly changing the speed.

While, in the present embodiment, the number of times of changing the phase difference between the driving voltages of the AB is three, the number of times of changing the phase difference from 30° to 110° is increased, whereby the speed is more smoothly changed.

Here, the ratio of the moving direction of the moving body to the direction into which the vibrator and the moving body are pushed away, in the elliptical motion of the contact portion, due to changing of the phase difference between the driving voltages of the AB, becomes large, as the phase difference between the driving voltages of the AB is changed from 0° to 180°. However, the phase difference between the driving voltages of the AB at the time of start and the phase difference between the driving voltages of the AB of when the frequency control is performed have optimum values according to a pressurized state of the contact portion, an amplitude of driving, a load of the actuator, and the like, and are not values determined to be 30° and 110°.

In the present embodiment, it is necessary to make the ratio of a component in the moving direction of the moving body to a component in the direction into which the vibrator and the moving body are pushed away smaller than after start, in the elliptical motion of the contact portion at the time of start, and to make the ratio of the component in the moving direction of the moving body large, in the elliptical motion of the contact portion, at the time of driving after start.

[Third Embodiment]

A configuration example of a driver of a vibrator will be described as a third embodiment, in which, in an elliptical motion (elliptical vibration) generated in a contact portion of a vibrating body at the time of start, the start is re-tried and the vibrator is reliably started when the vibrator is not started, by driving having a larger ratio of a component in a direction into which the vibrator and a moving body are pushed away than at the time of driving.

Figure 8:
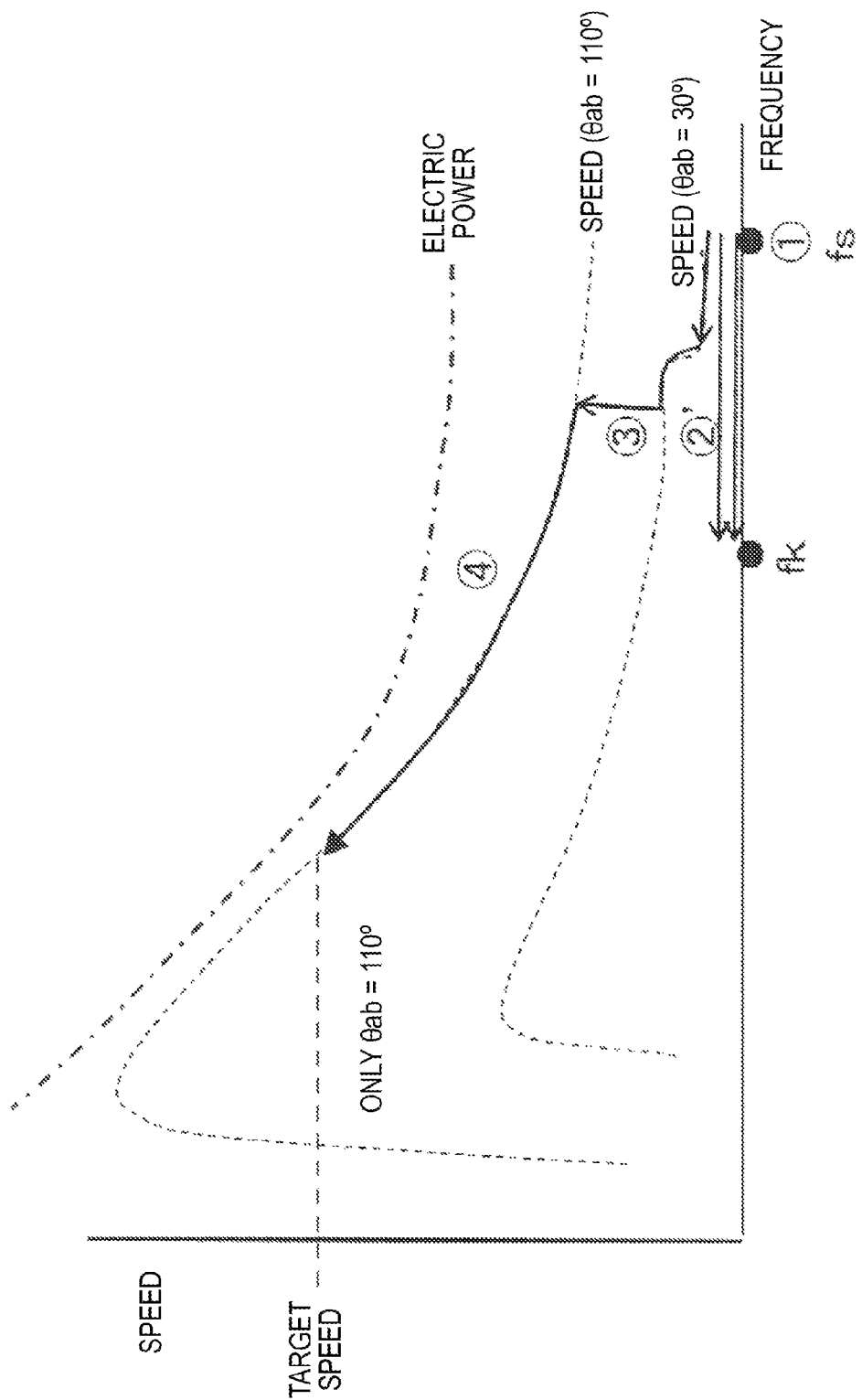
FIG. 8 is a diagram illustrating a frequency vs. an actuator speed, and electric power, for describing an algorithm in a driver of a vibrator.

FIG. 8 is a diagram illustrating a relationship of a frequency vs. an actuator speed, and electric power, for describing an algorithm of the third embodiment.

A configuration of a driving circuit of the present embodiment is the same as the configuration of FIG. 1 of the first embodiment, and is a configuration in which only a control algorithm is changed.

Figure 9:
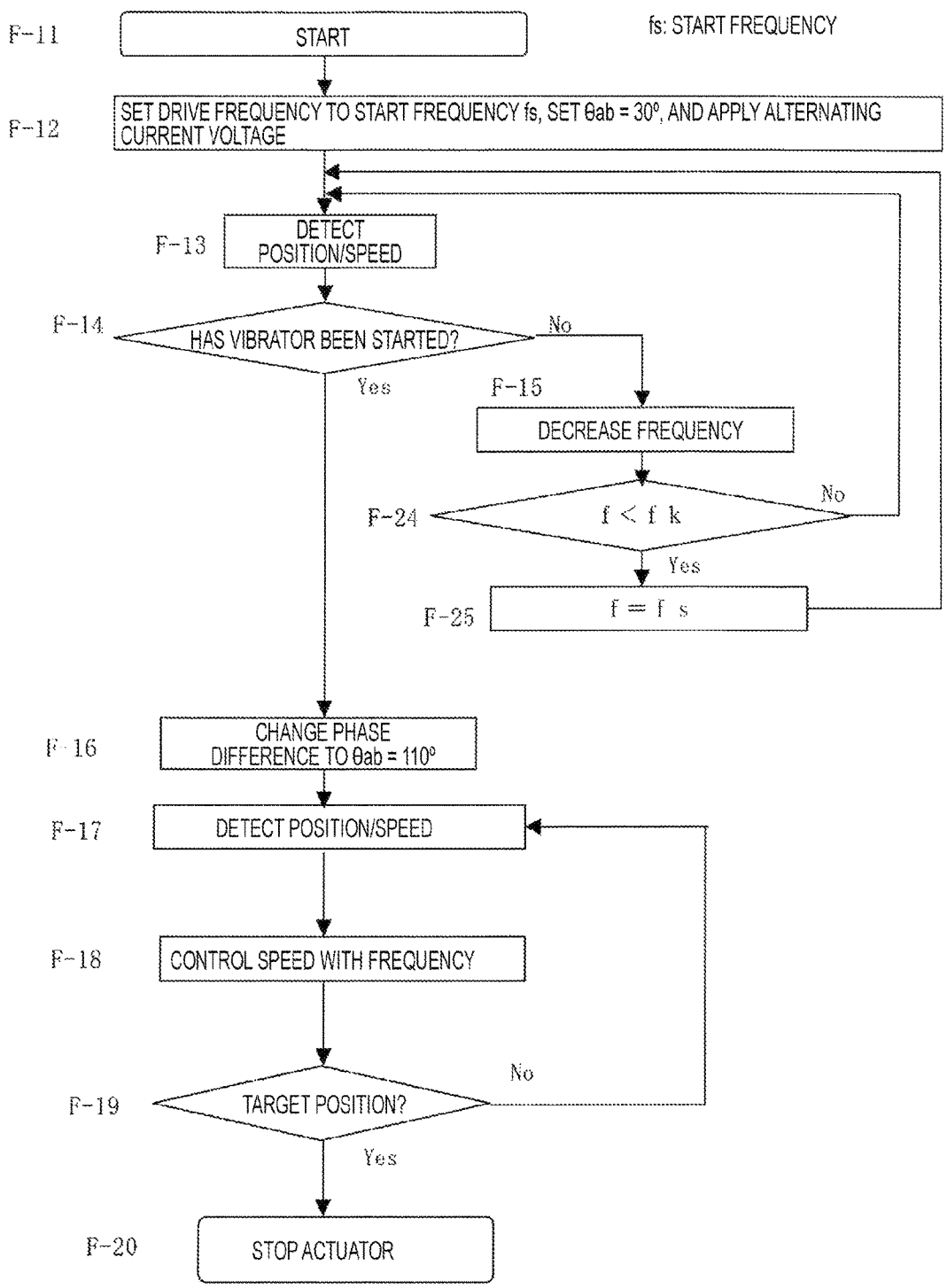
FIG. 9 is a flowchart illustrating the algorithm in the driver of the vibrator.

FIG. 9 illustrates the algorithm of the present embodiment, and an operation will be described with reference to FIG. 8.

At the time of start of the vibrator, similarly to the first embodiment, a frequency fs that is higher than a resonant frequency, and with which a speed of an actuator is sufficiently small is set, a phase difference Gab between two driving voltages is set to 30°, and an alternating current voltage is applied to a vibrator portion (F-11 and F-12) (the circled number 1 of FIG. 8).

Next, a current position and speed are detected with position detection means 15 (F-13).

Whether the vibrator is started is determined from change of the position or a speed value (F-14).

When the vibrator is not started, a drive frequency is decreased while the phase difference between the driving voltages of AB is kept to 30° (F-15).

Whether the frequency at this time becomes smaller than a frequency fk set in advance is compared (F-24).

Then, when the frequency becomes smaller than the frequency fk, the drive frequency is increased to return to fs (F-25).

Here, the limit frequency fk, into which the frequency is decreased, is a frequency of allowable maximum electric power at the time of starting the vibrator, or is a frequency of a maximum speed at which the vibrator can be smoothly started not to cause the user to feel impact or a sound, which is determined from visual sense or sense of hand of the user in advance, or determined with an acceleration sensor.

As described above, F-13 to F-15, F-24, and F-25 are repeated until the vibrator is started (the circled number 2' of FIG. 8).

As described above, the start operation is repeated within a range in which the electric power, the speed, and the like are allowable, whereby the vibrator can be more reliably started.

After the start of the vibrator, similarly to the first embodiment, the phase difference between the driving voltages of the AB is changed to 110°, and a ratio of a moving direction of a moving body to a direction into which the vibrator and the moving body are pushed away, in the elliptical motion generated in the contact portion, becomes large (F-16) (the circled number 3 of FIG. 8).

After the ellipse ratio becomes the ellipse ratio at which the vibrator can be efficiently driven, frequency control of detecting a speed and a position while changing the frequency, and increasing/decreasing the frequency according to the speed is performed, and control of stopping the driving after decreasing the speed when the speed reaches short of a target position is performed (F-17 to F-20).

Here, the circled number 4 of FIG. 8 illustrates the speed until reaching the target speed.

[Fourth Embodiment]

A configuration example will be described as a fourth embodiment, in which a piezoelectric element electrode pattern for generating an A mode and a B mode is configured in order to generate vibration of the A mode and the B mode in a vibrating body 1, and vibration of the generated mode becomes large if a voltage to be applied to electrodes is large.

Figure 10:
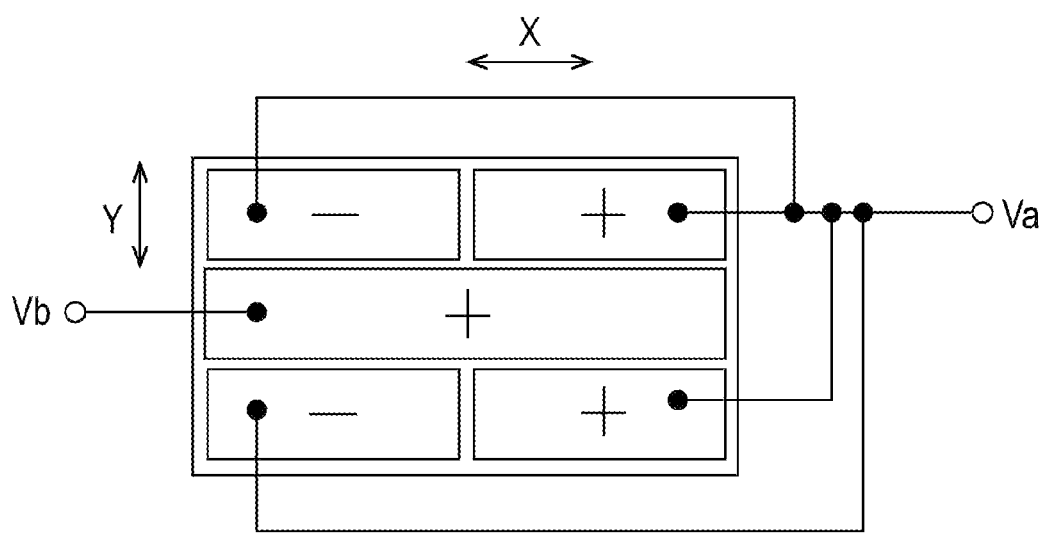
FIG. 10 is an electrode pattern diagram of a piezoelectric element used in a driver of a vibrator.

FIG. 10 illustrates an electrode pattern of a piezoelectric element that is a vibrator of a vibration-type actuator used in the present embodiment.

Figure 11:
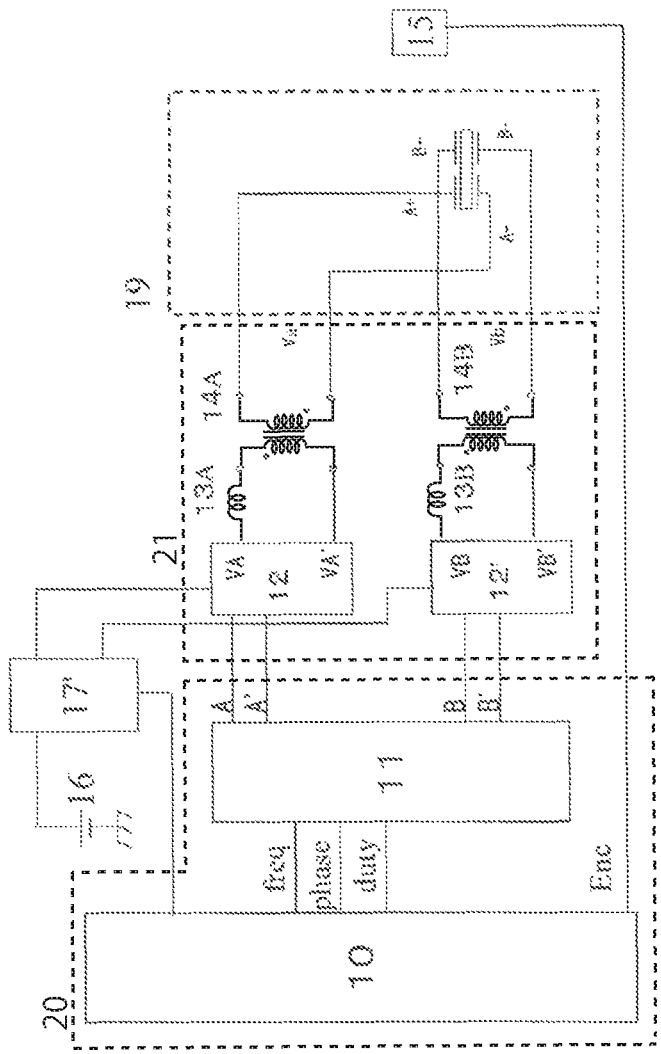
FIG. 11 is a block diagram illustrating a configuration of a control circuit in the driver of the vibrator.

FIG. 11 is a block diagram illustrating a configuration of a control circuit of a vibration-type vibrator. The signs "+" and "−" in FIG. 11 indicate polarization directions.

Four electrode areas to which a voltage signal (driving signal) (Va) is connected, of a piezoelectric element illustrated in FIG. 10, are electrode areas for generating vibration of the A mode.

When an alternating current voltage of a frequency in the vicinity of a resonant frequency of the A mode is applied to Va, at a certain moment, two electrode areas (piezoelectric elements) subjected to polarization processing to be polarized to "+", of the four electrode areas, are expanded, and two electrode areas (piezoelectric elements) subjected to the polarization processing to be polarized to "−" are contracted.

Further, at another moment, the electrode areas (piezoelectric elements) subjected to the polarization processing to be polarized to "+" are contracted, and the electrode areas (piezoelectric elements) subjected to the polarization processing to be polarized to "−" are expanded. As a result, the vibration of the A mode is generated.

Meanwhile, one electrode area to which a voltage signal (driving signal) (Vb) is connected, of the piezoelectric element illustrated in FIG. 10, is an electrode area for generating vibration of the B mode.

When an alternating current voltage of a frequency in the vicinity of the resonant frequency of the B mode is applied to Vb, a central portion of the piezoelectric element in a short side direction (Y direction) is expanded and extracted, and thus the vibration of the B mode is generated in the vibrating body.

Here, the alternating current voltages of Va and Vb are caused to have the same frequency with phases shifted by 90° (in the present embodiment, a frequency in the vicinity of the resonant frequencies of the A mode and the B mode), whereby elliptical motion is caused on the projection portion 6. With the configuration, an alternating current voltage ratio of Va and Vb becomes an occurrence ratio of the A mode and the B mode, that is, a ratio of an amplitude in a direction into which the vibrator having an elliptical shape generated in a contact portion and a moving body are pushed away, and an amplitude in a moving direction of the moving body. Therefore, by changing of the voltage ratio of the Va and Vb, an amplitude ratio of an ellipse generated in the contact portion can be changed.

As illustrated in the block diagram of a control circuit of FIG. 11, in the present embodiment, the DC/DC converter 17 is changed to a DC/DC converter 17' having two output and a programmable output voltage in order to cause the voltages of Va and Vb to be variable.

Further, one output is a power supply voltage of a switching circuit section 12, and the other output is a power supply voltage of a switching circuit section 12'.

Therefore, the voltages Va and Vb are output as voltages, which are outputs of the switching circuit sections through impedance matching circuits 13 and transformer circuits 14, and are applied between A+ and A− and between B+ and B− of the actuator.

Figure 12:
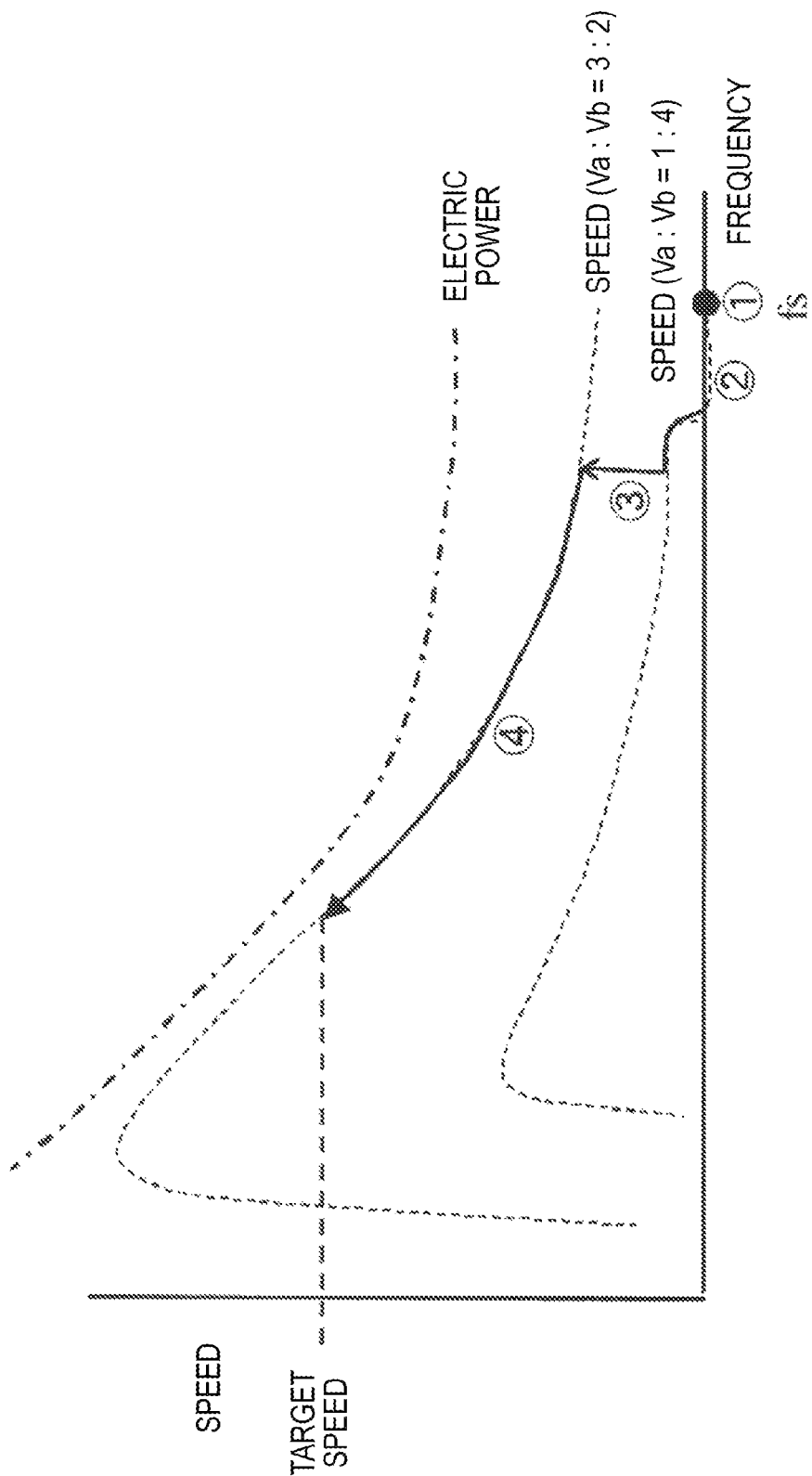
FIG. 12 is a diagram illustrating a frequency vs. an actuator speed, and electric power, for describing an algorithm in the driver of the vibrator.

FIG. 12 is a diagram illustrating a relationship of a frequency vs. an actuator speed, and electric power, for describing an algorithm of the present embodiment.

In the first to third embodiments, the ratio of the component in the direction into which the vibrator and the moving body are pushed away and the component in the moving direction of the moving body is changed with the phase difference between the driving voltages (driving signals) of the AB, in the elliptical motion generated in the contact portion. However, in the present embodiment, the ratio of the magnitude of the voltages Va and Vb to be applied to the piezoelectric element is changed.

Figure 13:
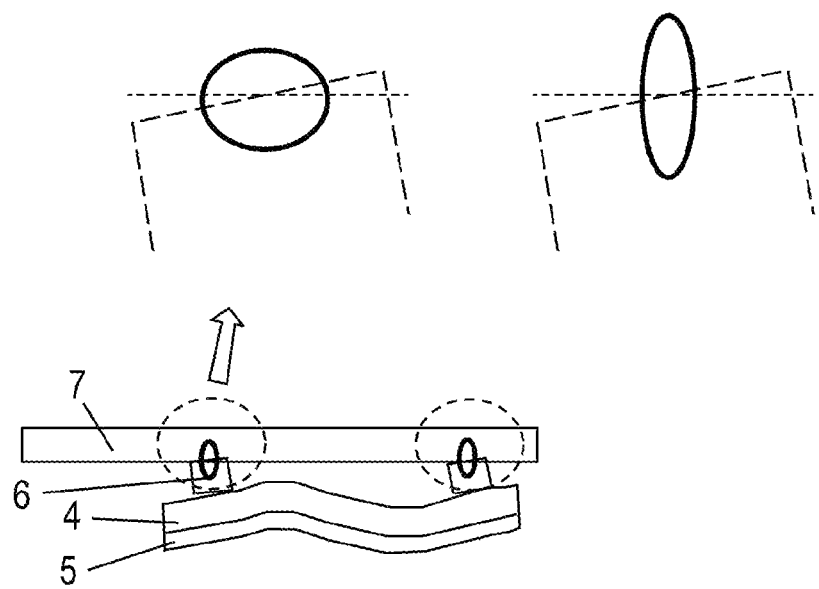
FIG. 13 is an image diagram of elliptical shapes of a contact portion used in the driver of the vibrator.

FIG. 13 illustrates an image of elliptical vibration generated in the contact portion of the vibrating body by changing of the magnitude of the Va and Vb, the elliptical vibration being one of ellipse ratio change means illustrated in the present embodiment.

Figure 14:
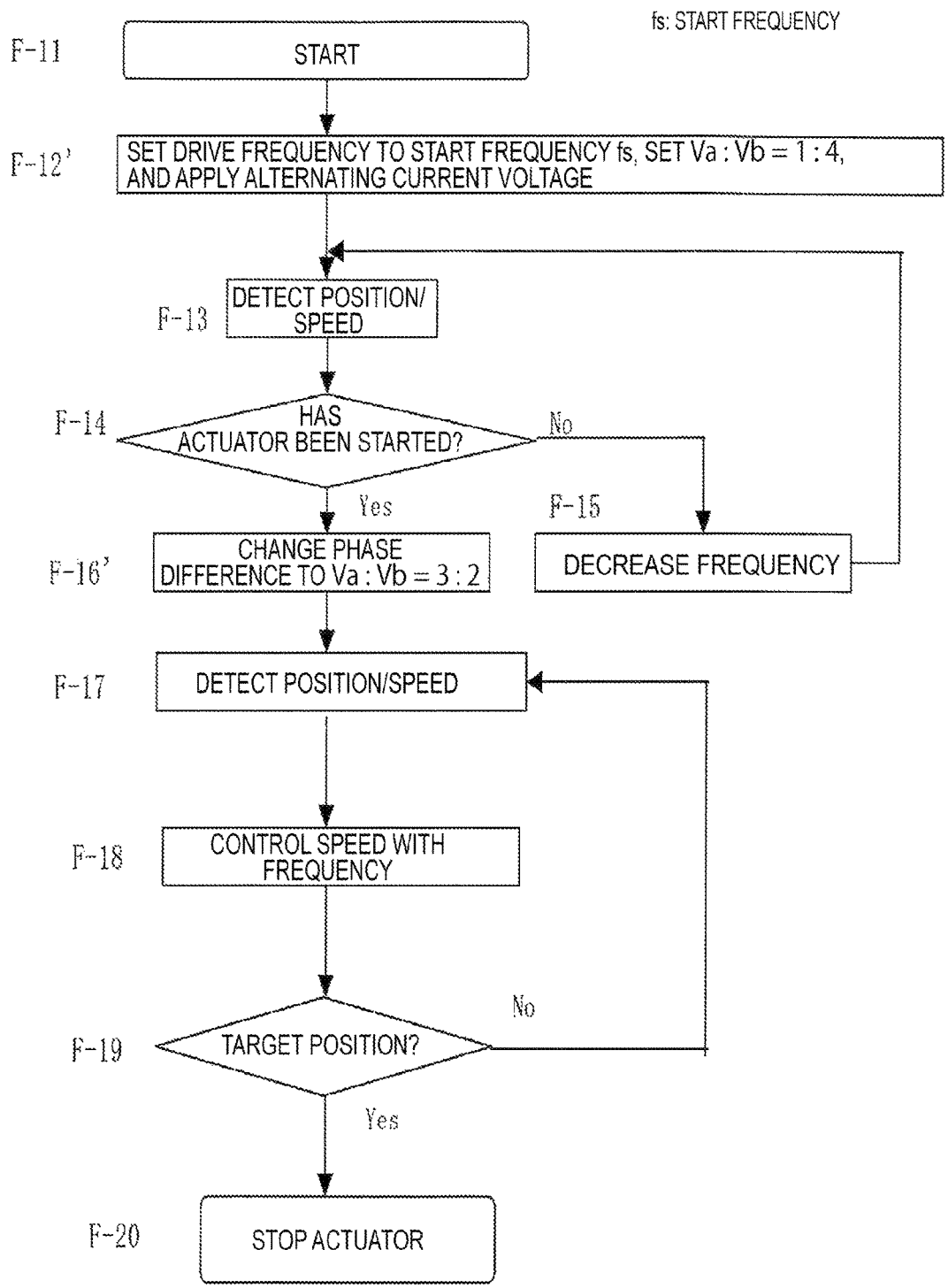
FIG. 14 is a flowchart illustrating the algorithm in the driver of the vibrator.

FIG. 14 illustrates an algorithm of the present embodiment, and an operation will be described with reference to FIGS. 12 and 13. At the time of starting the vibrator, a microcomputer 10 sets a frequency fs that is higher than a resonant frequency, and with which the speed of the actuator is sufficiently small, sets the ratio of the magnitude of the two driving voltages Va and Vb to 1:4, and applies an alternating current voltage to a vibrator portion (F-11 and F-12) (the circled number 1 of FIG. 12).

As can be seen from FIG. 13, when, the ratio of the magnitude of Va and Vb is caused to be 1:4, the shape of the elliptical motion generated in the contact portion becomes large in the direction into which the vibrator and the moving body are pushed away, and becomes small in the moving direction of the moving body. In this state, the speed of the moving body is not increased, but the vibrator and the moving body can be easily in contact and separated, and the vibrator can be easily started.

While, in the present embodiment, the ratio of the magnitude of Va and Vb are caused to be 1:4, the ratio is changed according to a pressurized state of the vibrator and the moving body, a friction coefficient or the shape of a frictional surface.

In the present embodiment, regarding the ratio of the magnitude of Va and Vb, the ratio of a component in the direction into which the vibrator and the moving body are pushed away is made larger than the ratio of the magnitude of Va and Vb used in a normal driving state, that is, the ratio of a component in the moving direction of the moving body is made smaller, whereby startability can be improved.

Next, the microcomputer 10 detects a current position and speed with position detection means 15 (F-13).

The microcomputer 10 determines whether the vibrator is started from change of the position or a speed value (F-14).

When the vibrator is not started, the microcomputer 10 decreases the drive frequency while keeping the ratio of the magnitude of Va and Vb to 1:4 (F-15).

The microcomputer 10 repeats F-13 to F-15 until the vibrator is started (the circled number 2 of FIG. 12).

Here, when the vibrator is started, the microcomputer 10 changes the ratio of the magnitude of Va and Vb to 3:2, and causes the ratio of the component in the moving direction of the moving body to the component in the direction into which the vibrator and the moving body are pushed away, in the elliptical motion generated in the contact portion, to become large. With such an ellipse ratio, the moving body can be efficiently moved at a high speed (F-16) (the circled number 3 of FIG. 12).

As described above, frequency control of detecting the speed and the position while changing the frequency in the state where the ellipse ratio is caused to be an ellipse ratio at which the vibrator is efficiently driven, that is, in the normal driving state, and stopping the driving when the speed reaches a target position is performed (F-17 to F-20) (the circled number 4 of FIG. 12).

As described above, the elliptical shape of the contact portion is caused to be the elliptical shape suitable for start at the time of starting the vibrator, and is caused to be the elliptical shape with which the vibrator can be efficiently driven after the start, whereby the starting characteristics can be improved. Means for changing the elliptical shape may be the phase difference between the AB voltages in one electrode pattern, or may be the ratio of the voltages Va and Vb in another electrode pattern, and any method may be used in order to achieve the objective.

[Fifth Embodiment]

A configuration example of a driving mechanism of a driver of the present invention will be described with reference to FIG. 15, as a fifth embodiment.

A vibration-type driver of the present embodiment illustrates a configuration example of a lens, and includes a moving body portion provided with a holding and pressurizing mechanism to hold and provide a pressure to a vibrator portion of a vibration-type actuator, and a first guide bar and a second guide bar that are arranged in parallel, and slidably hold the moving body portion.

Then, the vibration-type driver generates relative moving force between a vibrator and the second guide bar that comes in contact with a contact portion of the vibrator due to elliptical motion of the contact portion of the vibrator portion generated due to application of a driving voltage to an electro-mechanical transduce.

Accordingly, the vibration-type driver is configured to be able to move the moving body along the first and second guide bars.

Figure 15:
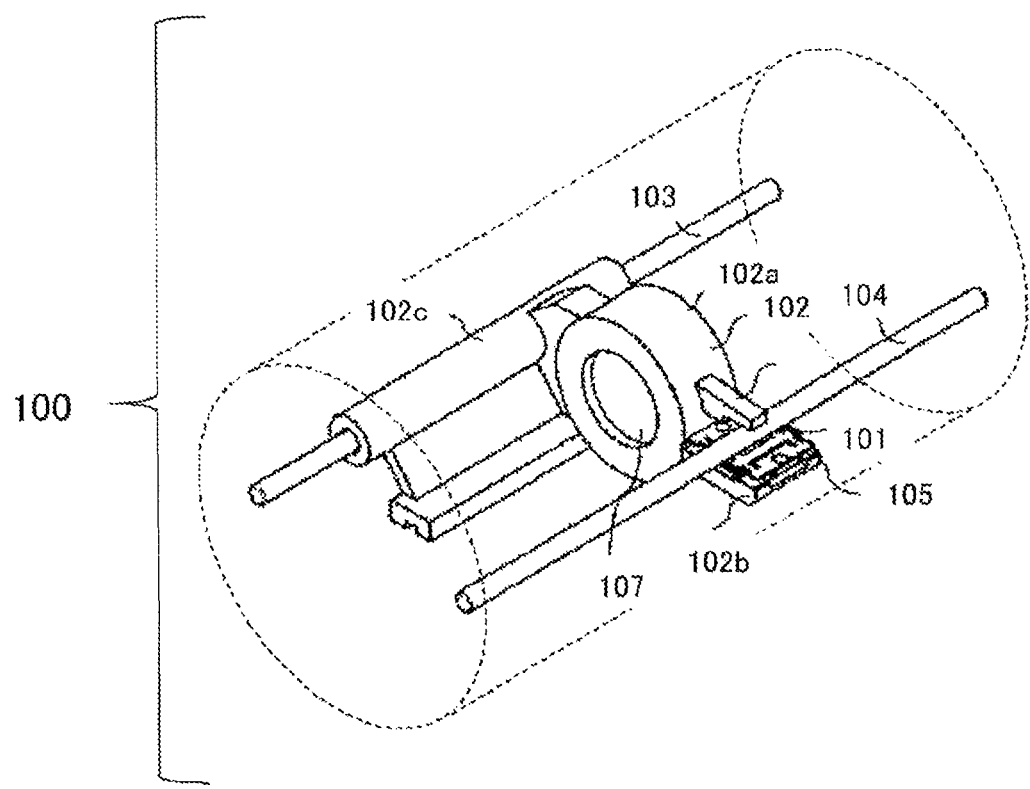
FIG. 15 is a diagram illustrating a configuration example of a driving mechanism of a lens driver.
Figure 16:
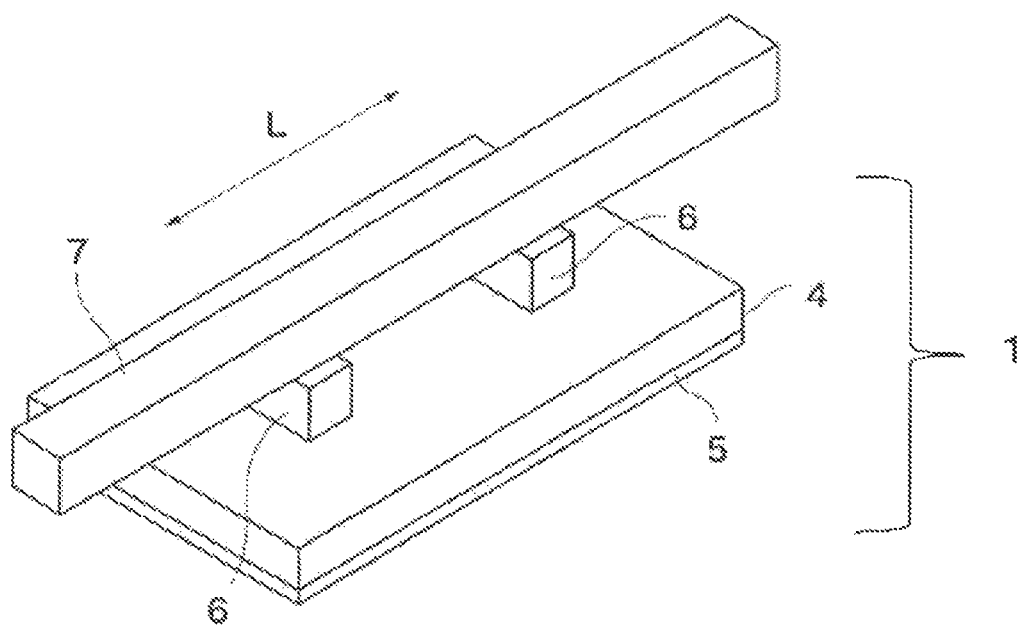
FIG. 16 is a configuration diagram of parts of a vibration-type actuator.

To be specific, as illustrated in FIG. 15, the driving mechanism of the moving body portion of a vibration-type driver 100 of the present embodiment is mainly configured from a lens holder 102, lens 107, a vibrator portion 101, a supporting and pressurizing portion 105, two guide bars 103 and 104, and a base body illustrated by the dotted line.

The first guide bar 103 and the second guide bar 104 configured from two guide bars are configured such that both ends of the respective guide bars are held and fixed by the base body so that the guide bars are arranged parallel to each other.

The lens holder 102 is configured from a cylindrical holder portion 102a, a holding portion 102b that holds and fixes the vibrator portion 101 and the supporting and pressurizing portion 105, and a first guide portion 102c fit into the first guide bar 103 and functions as a guide.

Further, the two contact portions provided in the vibrator portion 101 are brought into pressure-contact with the second guide bar 104 to form a second guide portion.

By applying of the driving voltage to the vibrator portion 101, elliptical motion is generated in the vibrator portion 101, and the lens holder 102 and the lens 107 are moved in an optical axis direction of the lens along the pressure-contact guide bar 104. With such a configuration, the lens group is moved into the optical axis direction, whereby an autofocus operation or a zoom operation becomes possible.

Here, by use of the driving methods of the first to fourth embodiments, a characteristic at the time of start is improved, and a lens derive device that can reliably drives the lens can be realized. Note that, in the present embodiment, a configuration in which the vibrator portion 101 is moved together with the lens holder 102 has been described. However, a configuration in which the vibrator is not moved, and the lens holder 102 is moved with respect to the vibrator may be employed.

Figure 20:
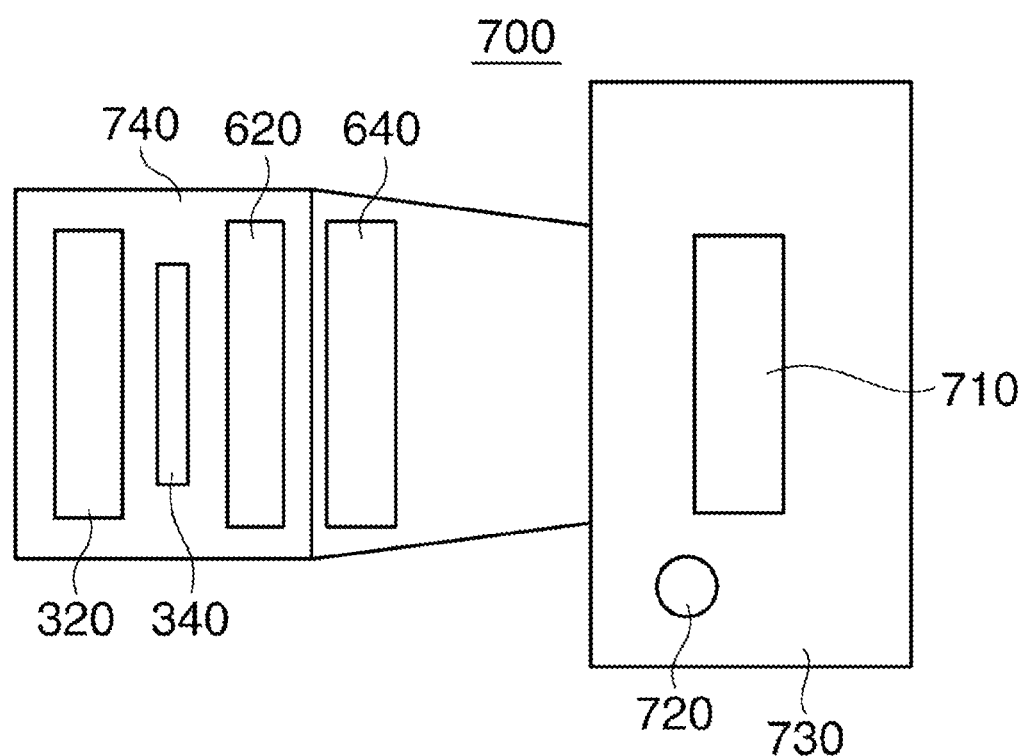
FIG. 20 is a diagram describing an application example of a driver.

Further, as an application example of the driver, an imaging device is illustrated in FIG. 20. FIG. 20 is a top view illustrating a schematic configuration of an imaging device 700. The imaging device 700 includes a camera main body 730 in which an image pickup element 710 and a power supply button 720 are mounted. Further, the imaging device 700 includes a lens barrel 740 including a first lens group (not illustrated), a second lens group 320, a third lens group (not illustrated), a fourth lens group 340, and vibrators 620 and 640. The image pickup element 710 is provided on an optical axis of the fourth lens group. The lens barrel 740 is replaceable as an interchangeable lens, and the lens barrel 740 suitable for an object to be shot can be attached to the camera main body 730. In the imaging device 700, the two vibrators 620 and 640 respectively drive the second lens group 320 and the fourth lens group 340. The drivers of the above-descried embodiments can be used for any one of the first to fourth lens groups, and the characteristic at the time of start can be improved, and an imaging device that enables a stable operation of a lens driving portion with less electric power can be realized.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-263554, filed Dec. 20, 2013, and Japanese Patent Application No. 2014-220843, filed Oct. 29, 2014, which are hereby incorporated by reference herein in their entirety.

What is claimed is:

1. A driver of a vibrator comprising:
a control section; and
an alternating current signal generation section configured to generate alternating current signals based on an output from the control section, and to apply the alternating current signals to the vibrator, wherein,
the control section is configured:
to perform first setting of setting a frequency of the alternating current signals applied to the vibrator to a first frequency, and setting at least one of a voltage ratio and a phase difference of the alternating current signals applied to the vibrator such that an ellipse ratio of elliptical motion caused in a contact portion of the vibrator becomes a first ellipse ratio;
to perform, after the first setting, second setting of setting the frequency to a second frequency, and setting at least one of the voltage ratio and the phase difference such that the ellipse ratio becomes the first ellipse ratio; and
to perform, after the second setting, third setting of setting the frequency of the alternating current signals applied to the vibrator to the second frequency, and setting at least one of the voltage ratio and the phase difference such that the ellipse ratio becomes a second ellipse ratio, wherein:
the vibrator and a driven body contacting the contact portion perform relative movement in a moving direction by the elliptical motion,
the second frequency is smaller than the first frequency, and
the second ellipse ratio has a larger ratio of a component in the moving direction in the elliptical motion to a component in a direction perpendicular to the moving direction in the elliptical motion than the first ellipse ratio.

2. The driver according to claim 1, wherein the control section is configured to compare the second frequency and a predetermined frequency when the vibrator has not been driven after performing the second setting, and to set the frequency of the alternating current signals applied to the vibrator to the first frequency and to set at least one of the voltage ratio and the phase difference of the alternating current signals applied to the vibrator such that the ellipse ratio of the elliptical motion caused in the contact portion of the vibrator becomes the first ellipse ratio when the second frequency is smaller than the predetermined frequency.

3. A vibration device, comprising:
a vibrator including an elastic member and an electro-mechanical transducer fixed to the elastic member; and
the driver according to claim 1.

4. The vibration device according to claim 3, wherein the control section is configured to compare the frequency and a predetermined frequency when the vibrator has not been driven after performing the second setting, and to set the frequency of the alternating current signals applied to the vibrator to the first frequency and to set at least one of the voltage ratio and the phase difference of the alternating current signals applied to the vibrator such that the ellipse ratio of the elliptical motion caused in the contact portion of the vibrator becomes the first ellipse ratio when the second frequency is smaller than the predetermined frequency.

5. The vibration device according to claim 3,
wherein the electro-mechanical transducer includes two electrodes,
wherein a first vibration mode is caused in the vibrator when alternating current voltages having a same phase are applied to the two electrodes,
wherein a second vibration mode is caused in the vibrator when alternating current voltages having reversed phases are applied to the two electrodes, and
wherein the elliptical motion is caused by combining the first vibration mode and the second vibration mode.

6. The vibration device according to claim 5,
wherein the ellipse ratio of the elliptical motion caused in the contact portion of the vibrator is changed by adjustment of a phase difference of the alternating current voltages applied to the two electrodes.

7. The vibration device according to claim 3,
wherein the electro-mechanical transducer includes one or more first electrodes provided to generate a first vibration mode in the vibrator, and one or more second electrodes provided to generate a second vibration mode, and
wherein the elliptical motion is caused by applying alternating current voltages to the one or more first electrodes and the one or more second electrodes.

8. The vibration device according to claim 7, wherein the ellipse ratio of the elliptical motion caused in the contact portion of the vibrator is changed by adjustment of a voltage ratio of the alternating current voltages applied to the electrodes.

9. An imaging device comprising:
a lens;
a lens holder that holds the lens;
the vibration device according to claim 3 configured to drive the lens holder; and
an image pickup element on an optical axis of the lens.

10. The driver according to claim 1, wherein the control section performs the first setting and the second setting before the relative movement starts and performs the third setting after the relative movement starts.

11. A method of driving a vibrator, comprising successively, the steps of:
first, setting a frequency of alternating current signals applied to the vibrator to a first frequency, and setting at least one of a voltage ratio and a phase difference of the alternating current signals such that an ellipse ratio of elliptical motion caused in a contact portion of the vibrator becomes a first ellipse ratio,
second, setting the frequency to a second frequency, and setting at least one of the voltage ratio and the phase difference such that the ellipse ratio becomes the first ellipse ratio, and
third, setting the frequency of the alternating current signals applied to the vibrator to the second frequency, and setting at least one of the voltage ratio and the phase difference such that the ellipse ratio becomes a second ellipse ratio, wherein:
the vibrator and a driven body contacting the contact portion perform relative movement in a moving direction by the elliptical motion,
the second frequency is smaller than the first frequency, and
the second ellipse ratio has a larger ratio of a component in the moving direction in the elliptical motion to a component in a direction perpendicular to the moving direction in the elliptical motion than the first ellipse ratio.

12. The method for driving a vibrator according to claim 11, wherein a drive frequency applied when the vibrator is started is higher than a frequency started to work when the vibrator has been started with the first ellipse ratio.

13. The method for driving a vibrator according to claim 11, wherein, when the driven body is not relatively moved with respect to the vibrator until the frequency becomes a predetermined frequency when the frequency is swept at the first ellipse ratio, the frequency is caused to be in a higher state again, and is then swept in a direction into which the frequency becomes lowered.

14. The method for driving a vibrator according to claim 11, wherein the ellipse ratio of the elliptical motion caused in the contact portion of the vibrator is changed by adjustment of a phase difference of alternating current voltages applied to two electrodes of the vibrator.

15. A driver of a vibrator including a contact portion that performs elliptical motion, the driver comprising:
a generation section configured to generate alternating current signals to be applied to the vibrator; and
a setting section configured to set a frequency of the alternating current signals and at least one of a voltage ratio and a phase difference of the alternating current signals;
wherein, the contact portion and a driven body contacting the contact portion perform relative movement in a relative movement direction by the elliptical motion, and
wherein the setting section is configured:
(1) to perform first setting of setting at least one of the voltage ratio and the phase difference so that a component in a direction perpendicular to the relative movement direction of the elliptical motion becomes larger than a component in the relative movement direction of the elliptical motion;
(2) to perform second setting of changing, after the first setting, the frequency so that the component in the direction perpendicular to the relative movement direction increases; and
(3) to perform third setting of changing, after the second setting, at least one of the voltage ratio and the phase difference so that the component in the relative movement direction increases.

16. The driver according to claim 15, wherein the setting section changes, in the second setting, the frequency so that the component in the direction perpendicular to the relative movement direction increases, while maintaining a state in which the component in the direction perpendicular to the relative movement direction is larger than the component in the relative movement direction.

17. The driver according to claim 15, wherein the setting section changes, in the third setting, at least one of the voltage ratio and the phase difference so that the component in the relative movement direction becomes larger than the component in the direction perpendicular to the relative movement direction.

18. The driver according to claim 15, wherein the setting section performs the first setting and the second setting before the relative movement starts and performs the third setting after the relative movement starts.

19. The driver according to claim 18, further comprising a position detecting section configured to detect a position of the driven body, wherein the setting section determines whether the relative movement starts from a detection result of the position detecting section.

20. A vibration device, comprising:
   a vibrator including an elastic member and an electro-mechanical transducer fixed to the elastic member; and
   the driver according to claim 15.

21. An imaging device comprising:
   a lens;
   a lens holder that holds the lens;
   the vibration device according to claim 20 configured to drive the lens holder; and
   an image pickup element on an optical axis of the lens.

* * * * *